United States Patent [19]

Fukusho et al.

[11] Patent Number: 5,393,997
[45] Date of Patent: Feb. 28, 1995

[54] CCD HAVING TRANSFER ELECTRODES OF 3 LAYERS

[75] Inventors: Takashi Fukusho; Isao Hirota; Motoyuki Koike, all of Kanagawa, Japan

[73] Assignee: Sony Corporation, Tokyo, Japan

[21] Appl. No.: 264,257

[22] Filed: Jun. 22, 1994

Related U.S. Application Data

[63] Continuation of Ser. No. 19,843, Feb. 19, 1993, abandoned.

[30] Foreign Application Priority Data

Feb. 21, 1992 [JP] Japan .................................. 4-035322

[51] Int. Cl.$^6$ .................... H01L 29/78; H01L 27/14; H01L 31/00
[52] U.S. Cl. .................... 257/232; 257/233; 257/241; 257/250
[58] Field of Search ............... 257/225, 231, 232, 233, 257/241, 249, 250

[56] References Cited

U.S. PATENT DOCUMENTS 4,689,687  8/1987  Koike et al. .................... 257/232

FOREIGN PATENT DOCUMENTS 60-38869   2/1985  Japan .................... 257/233
62-190754  8/1987  Japan .................... 257/231

Primary Examiner—Ngân V. Ngô
Attorney, Agent, or Firm—Hill, Steadman & Simpson

[57] ABSTRACT

A solid state imager device comprises a plurality of pixels arranged in rows and columns, each of the pixels consisting of a light sensing element and a vertical transfer portion adjacent to the light sensing element, the vertical transfer portion having three gate portions such as a first, a second and a third gate portions insulated each other, the third gate portion located in the center of the three gate portions, a plurality of rows of base portions disposed in the horizontal direction and connecting the respective gate portions, a vertical wiring device disposed over the gate portions through an insulating layer, the vertical wiring device including, a first wiring film connecting the first gate portions, a second wiring film connecting the second gate portions, a third wiring film connecting the third gate portions which is connected to the odd row of the base portions, a fourth wiring film connecting the third gate portions which is connected to the even rows of the base portions, a read out pulse device for supplying a read out voltage pulse to the third and fourth wiring films, and a transfer pulse device for supplying a transfer voltage pulse to the three gate portions so as to transfer signal charges in the vertical direction.

4 Claims, 21 Drawing Sheets

F I G. 22
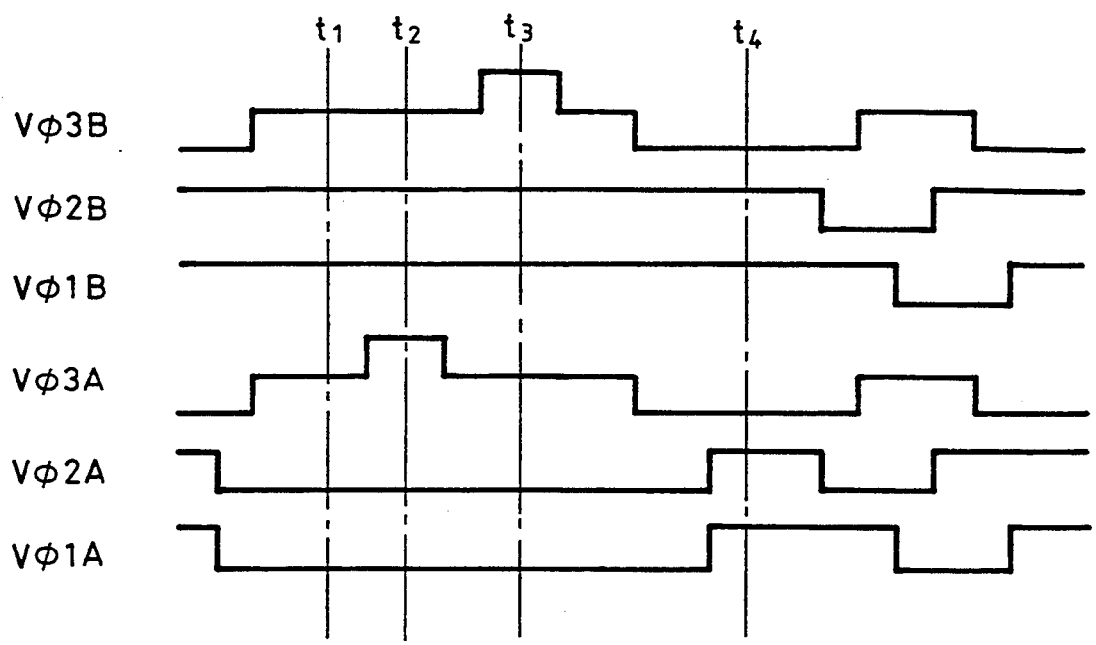
F I G. 23
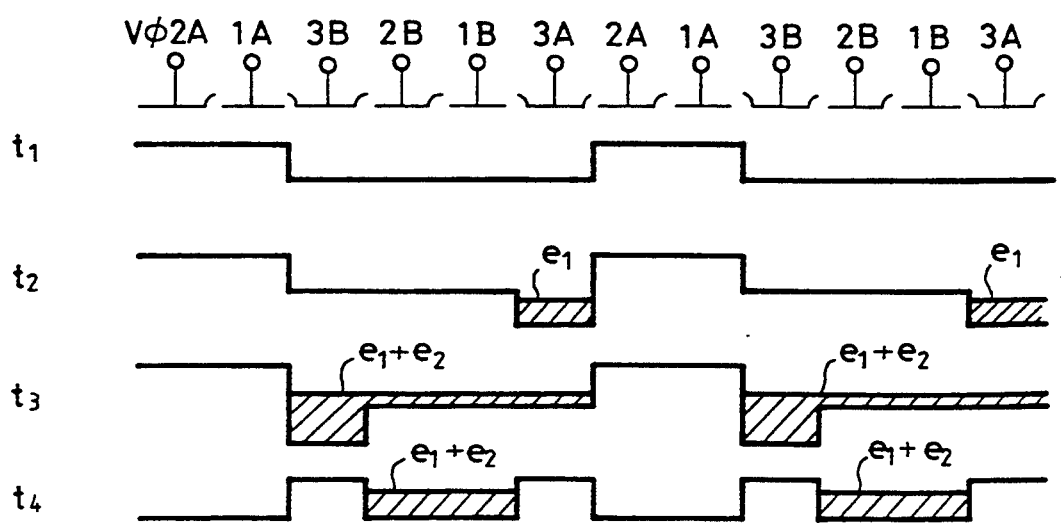

CCD HAVING TRANSFER ELECTRODES OF 3 LAYERS

This is a continuation of application Ser. No. 08/019,843, filed Feb. 19, 1993, now abandoned.

BACKGROUND OF THE INVENTION

1. Field of the Invention

The present invention generally relates to solid state image sensing elements and, more particularly, is directed to a CCD (charge coupled device) image sensor of an interline transfer system and a CCD image sensor of a frame interline transfer system.

2. Description of the Prior Art

Transfer electrodes in a vertical register of a conventional CCD solids state imager, for example, are wired such that lead wire units extending in the horizontal direction and electrode units projecting along the vertical register are formed as one unit by a polycrystalline silicon layer, for example.

A CCD solid state imager of a full-pixel read out system having transfer electrodes of three layers to which three-phase drive pulses having different phases are supplied will be described more fully. As shown in FIGS. 1 and 2, a transfer electrode 21 formed of a first polycrystalline silicon layer comprises s first leader 21a extending in a light sensing portion 26 (region shown by a width Ws in FIG. 2) and a first electrode portion 21b (shown by a solid line in FIG. 2) downwardly projecting along a vertical register 27 (region shown by a width Wr in FIG. 2). A transfer electrode 22 formed of a second polycrystalline silicon layer comprises a second leader 22a extending in the horizontal direction on the first leader 21a and a second electrode portion 22b (see a solid line in FIG. 2) upwardly projecting along a vertical register 27. A transfer electrode 23 formed of a third polycrystalline silicon layer comprises a third leader 23a extending in the horizontal direction on the second leader 22a and a third electrode portion 23b (see a one-dot chain line in FIG. 2) downwardly projecting from the end portion of the second electrode portion 22b along the vertical register 27. In FIG. 2, a region shown by a width Wc represents a channel-stopper region.

In the above conventional CCD solid state imager, the first, second and third leader portions 21a, 22a, and 23a in the respective transfer electrodes 21, 22 and 23 are wired on the space between the light sensing portions in the vertical direction. Further, when the respective transfer electrodes 21, 22 and 23 are formed by the patterning-process, misalignment must be taken into consideration. Therefore, the wiring widths of the leader portions 21a, 22a and 23a must be decreased in the upper layers. That is, assuming that $W_1$, $W_2$, and $W_3$ represent wiring widths in the first, second and third leader portions 21a, 22a and 23a, then a relationship of $W_1 > W_2 > W_3$ must be established.

Since the wiring width $W_3$ in the third leader portion 23 is reduced the most as described above, the wiring resistance in the third leader portion 23a is increased, which causes a propagation delay of a drive pulse. The propagation delay of the drive pulse causes a failure in electric charges processed by the vertical register 27 and a failure in the transfer of electrical charges. There is then the disadvantage that the picture quality is considerably deteriorated. In particular, when the drive pulses are supplied from the left and right ends of the respective transfer electrodes 21, 22 and 23, a propagation delay of drive pulse occurs in the central portion of the image region. Consequently, there are disadvantages in that an electrical charge failure and a failure of electrical charge transfer may occur in the central portion.

Therefore, it is proposed that the wiring width $W_3$ of the third leader portion 23a be increased. In this case, the wiring width $W_1$ of the first leader portion 21a is increased and the opening width of the light sensing unit 26 is decreased. There is then the disadvantage that the sensitivity decreases. Further, it is proposed that the wiring widths $W_2$ and $W_3$ of the second and third leader portions 22a and 23a be made the same. It is, however, very difficult to form the wiring widths $W_2$ and $W_3$ the same because of misalignment or the like in the patterning-process.

As another method, there is proposed a method in which the respective transfer electrodes 21, 22 and 23 are formed of polycrystalline silicon layers and tungsten silicide layers, i.e., formed as a polycide structure. In this case, as compared with the case where the transfer electrode is formed of only the polycrystalline silicon layer, there is the advantage that the wiring resistance can be considerably reduced.

When the CCD imager is applied to the image sensor of a frame interline transfer system, an electrical charge transfer speed of 40 to 100 times the transfer speed of the interline transfer system image sensor is required. Therefore, only by making the transfer electrode low in resistance can the aforesaid disadvantages be removed. In addition, the aforesaid method cannot be at present be accomplished to the extent such that the characteristics will not be deteriorated. Accordingly, a new process must be developed.

To solve the problems, there is proposed a technique in which the third transfer electrode is shunted by a metal film such as Al or the like. In the transfer electrode pattern of FIG. 2, the first electrode portion 21b in the first layer is covered with the third electrode portion 23b in the third transfer electrode 23 so that a shunt structure in which the metal films are connected to the transfer electrodes 21, 22 and 23 of the respective layers cannot be realized.

Therefore, there is proposed a method in which the third transfer electrode 23 is formed across the light sensing portion 21 in the horizontal direction to thereby expose the electrode portions 21b, 22b and 23b of the respective transfer electrodes 21, 22 and 23. In this case, metal films 31 formed along the vertical register on the respective transfer electrodes 21, 22 and 23 and the respective transfer electrodes 21, 22 and 23 can be easily electrically connected, thereby making it possible to easily make a shunt structure. In the illustrated example, with respect to (3n+1)'th column (n=0, 1, 2 . . . ), the third transfer electrode (third electrode portion 23b) and the metal film 31 are connected. With respect to the (3n+2)'th column, the first transfer electrode (first electrode portion 21b) and the metal film 31 are connected. Then, with respect to the (3n+3)'th column, the second transfer electrode (second electrode portion 22b) and the metal film 31 are connected.

In the CCD solid state imager shown in FIG. 3, since the third transfer electrode 23, particularly, the third leader portion 23a crosses the light sensing portion 26, an effective opening ratio of the light sensing portion 26 is decreased and the influence of noise of a signal charge during a low intensity illumination (shot noise) is increased. Also, depending on the voltage condition of the drive pulse supplied thereto, the surface of the light sensing portion 26 becomes a depletion layer and the dark current is increased.

In other proposed examples, as shown in FIGS. 4 to 7, the first electrode portion 21b in the first transfer electrode 21 projects downwardly along the vertical register (see FIG. 5) and the second electrode portion 22b in the second transfer electrode 22 is projects upwardly along the vertical register (see FIG. 6). The third electrode layer 23 comprises as shown in FIG. 7 a short-circuit electrode portion 23S which extends in the vertical transfer direction in a certain column, a first electrode portion $23b_1$ which projects downwardly along the vertical register in another column and a second electrode portion $23b_2$ which projects upwardly along the vertical register in another column.

As shown in FIG. 4, since the respective transfer electrodes 21, 22 and 23 are sequentially laminated, the light sensing portion 26 is not crossed by the third transfer electrode 23 and the electrode portions 21b, 22b, $23b_1$ and $23b_2$ of the respective transfer electrodes 21, 22 and 23 can be exposed, thereby realizing the full-pixel read out CCD image sensor of the frame interline transfer system without deteriorating the characteristics.

Further, in the CCD solid state image sensor shown in FIG. 4, the full pixel read out type is generally adopted. There is then the advantage that, a signal processing circuit of the succeeding stage can be simplified in the image processing of a non-interlace system.

When the CCD solid state image sensor having the transfer electrodes 21, 22 and 23 of the three layers is applied to the interlace system image processing such as an NTSC system or the like, the field read out system and the frame read out system are required for a signal charge read out system. According to the above CCD solid state image sensor, when signal charges of the light sensing portion 26 are read out under the first transfer electrode 21 or under the second transfer electrode 22, the read out system can be made so as to correspond to the field read out system or the frame read out system. However, when signal charges from the light sensing portion 26 are read out under the third transfer electrode 23, the field read out system and the frame read out system become impossible.

In actual practice, it is preferred that electrical charges are read out from the electrode of third layer. Because the electrode of third layer is opposed to the center of the light sensing portion and therefore, an electric field for read-out is easily applied to the whole of the light sensing portion. Also, when signal charges are read out by this electrode of the third layer, the opening portion from the light sensing portion to the channel is widest. The present invention will be described hereinafter on the assumption that signal charges are read out by the electrode of the third layer.

Further, when electrical charges are read out, a read out potential is applied to the read-out electrodes at the same time. At that time, the following problems occur. That is, a substrate potential is fluctuated by the potential applied to the electrode and the read-out operation becomes difficult or a higher potential is required in the read-out operation. Accordingly, it is desired that the read-out operation be carried out in every row at different timings.

Furthermore, it is preferred that the electrode area be made as small as possible. The reason for this is to reduce the influence exerted upon the substrate potential.

In the CCD solid state image sensor shown in FIG. 4, the third transfer electrode is supplied with only the same drive pulse on the short-circuit electrode portion 23S. Therefore, the above pulse driving method cannot be realized.

OBJECTS AND SUMMARY OF THE INVENTION

Therefore, it is an object of the present invention to provide a solid state imager in which the aforesaid shortcomings and disadvantages encountered with the prior art can be eliminated.

More specifically, it is an object of the present invention to provide a solid state imager in which the signal charge from the light sensing portion can be read out to the under side of the transfer electrode of the third layer so that not only the full-pixel read-out system corresponding to the non-interlace system but also the field read-out system and the frame read-out system corresponding to the interlace system can be easily achieved.

According to a first aspect of the present invention, there is provided a solid state imager device which comprises a plurality of pixels arranged in rows and columns, each of the pixels consisting of a light sensing element and a vertical transfer portion adjacent to the light sensing element, the vertical transfer portion having three gate portion such as a first, a second and a third gate portions insulated from each other, the third gate portion being located in the center of the three gate portions, a plurality of rows of base portions disposed in the horizontal direction and connecting the respective gate portions, vertical wiring devices disposed over the gate portions through an insulating layer, the vertical wiring device including, a first wiring film connecting the first gate portions, a second wiring film connecting the second gate portions, a third wiring film connecting the third gate portions and which is connected to the odd row of the base portions, a fourth wiring film connecting the third gate portions and which is connected to the even rows of the base portions, read out pulse devices for supplying a read out voltage pulse to the third and fourth wiring films, and transfer pulse means for supplying a transfer voltage pulse to the three gate portions so as to transfer signal charges in the vertical direction.

According to a second aspect of the present invention, there is provided a solid state imaging device which comprises a plurality of pixels arranged in rows and columns, each of the pixels consisting of a light sensing element and a vertical transfer portion adjacent to the light sensing element, the vertical transfer portion having three gate portion such as a first, a second and a third gate portions insulated each other, the third gate portion located in the center of the three gate portions, a plurality of rows of base portions disposed in the horizontal direction and connecting the respective gate portions, a plurality of bridge porions connecting the base portions and the third gate portions, the bridge portions lying over the first gate portions in first columns of pixels and lying over the second gate portions in second columns of pixels, vertical wiring devices disposed over the gate portions through an insulating layer, the vertical wiring means including, a first wiring film connecting the first gate portions, a second wiring film connecting the second gate portions, a third wiring film connecting the third gate portions which is connected to the odd rows of the base portions, a fourth wiring film connecting the third gate portions which is connected to the even rows of the base portions, read out pulse devices for supplying a read out voltage pulse to the third and fourth wiring films, and transfer pulse means for supplying a transfer voltage pulse to the three gate portions.

According to a third aspect of the present invention, there is provided a solid state imaging device which comprises a plurality of pixels arranged in rows and columns, each of the pixels consisting of a light sensing element and a vertical transfer portion adjacent to the light sensing element, the vertical transfer portion having three gate portion such as a first, a second and a third gate portions insulated each other, the third gate portion located in the center of the three gate portions, a plurality of rows of base portions disposed in the horizontal direction and connecting the respective gate portions, a plurality of bridge portions connecting the base portions and the third gate portions, the bridge portions lying over the first gate portions in first columns of pixels and lying over the second gate portions in second columns of pixels, vertical wiring devices disposed over the gate portions through an insulating layer, the vertical wiring device including, a first metal wiring film connecting the first gate portions which is connected to the odd rows of the base portions, a second metal wiring film connecting the first gate portions which is connected to the even rows of the base portions, a third metal wiring film connecting the second gate portions which is connected to the odd rows of the base portions, a fourth metal wiring film connecting the second gate portions which is connected to the even rows of the base portions, a fifth metal wiring film connecting the third gate portions which is connected to the odd rows of the base portions, a sixth metal wiring film connecting the third gate portions which is connected to the even rows of the base portions, read out pulse devices for supplying read out voltage pulses to the fifth and sixth metal wiring films, and transfer pulse devices for supplying transfer voltage pulses to the vertical metal wiring means.

The above and other objects, features, and advantages of the present invention will become apparent from the following detailed description of illustrative embodiments thereof to be read in conjunction with the accompanying drawings, in which like reference numerals are used to identify the same or similar parts in the several views.

BRIEF DESCRIPTION OF THE DRAWINGS

FIG. 22 is a timing chart showing output timings of drive pulses in the first field according to a second embodiment;

FIG. 23 is an operation conceptual diagram showing the state that electric charges are transferred in the first field according to the second embodiment;

DETAILED DESCRIPTION OF THE PREFERRED EMBODIMENTS

Embodiments of the present invention will hereinafter be described with reference to FIGS. 8 to 25.

Figure 1:
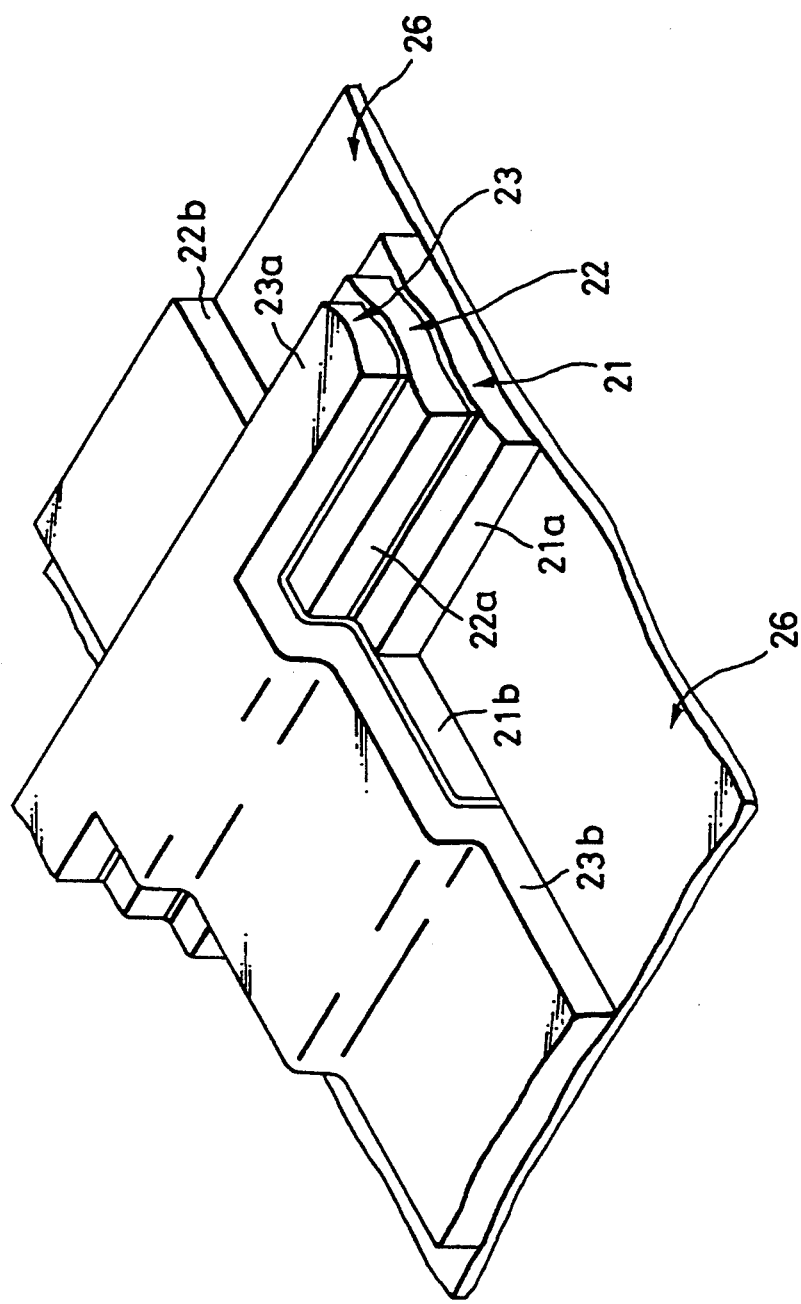
FIG. 1 is a perspective view showing the wiring state of transfer electrodes according to an example of the prior art in an enlarged scale.
Figure 2:
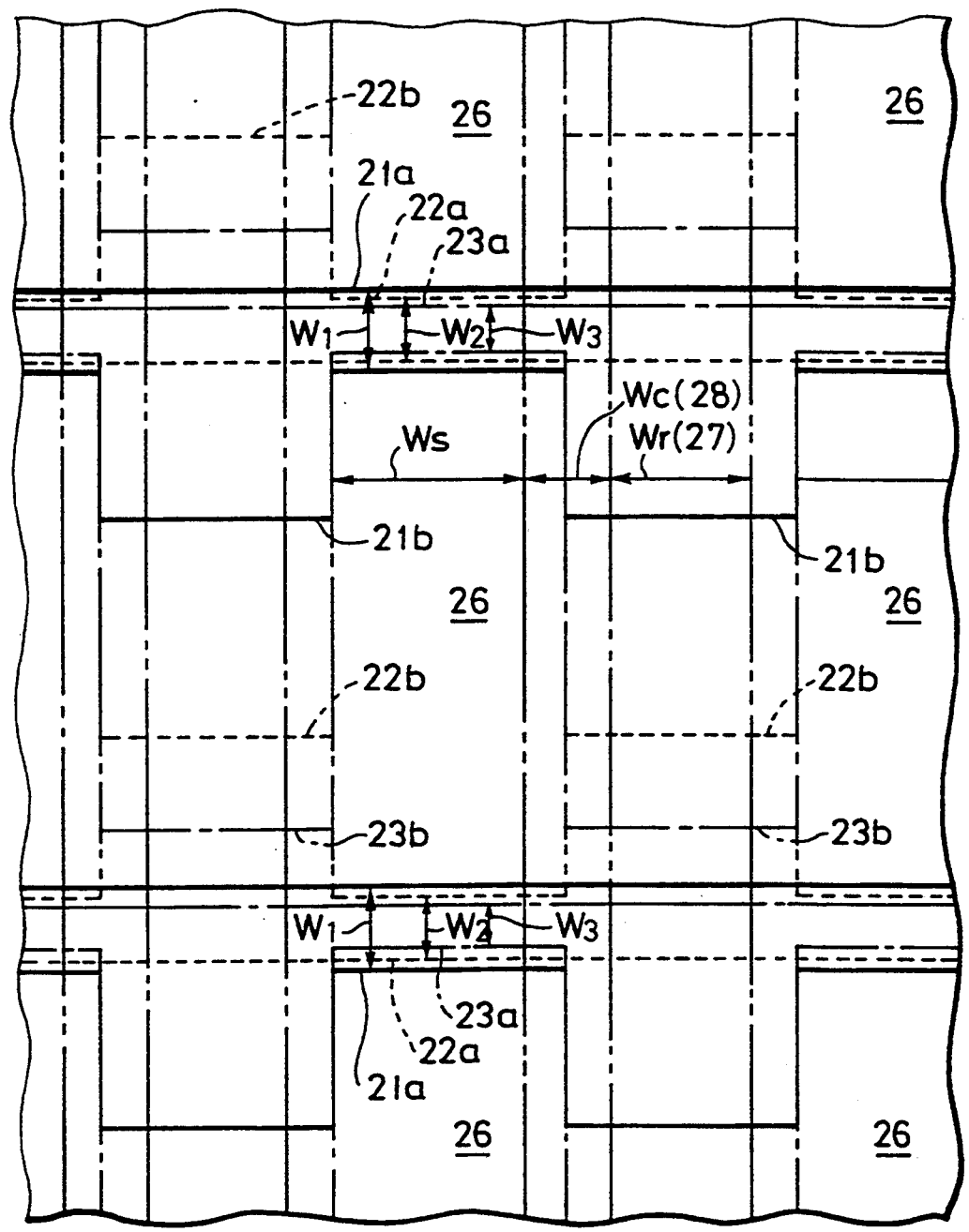
FIG. 2 is a plan view showing the wiring state of transfer electrodes according to the example of the prior art.
Figure 3:
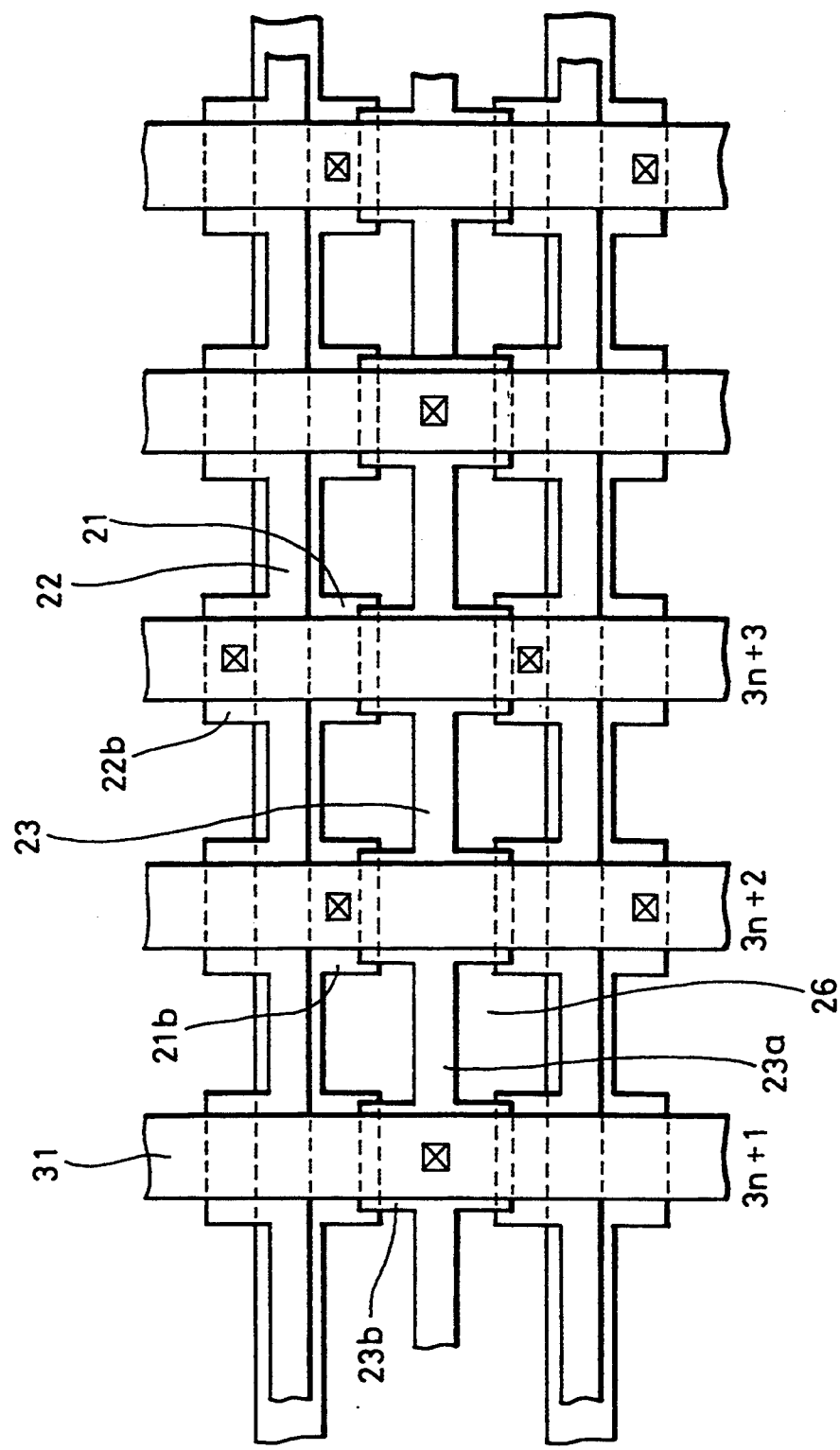
FIG. 3 is a plan view showing the wiring state of transfer electrodes according to a proposed example.
Figure 4:
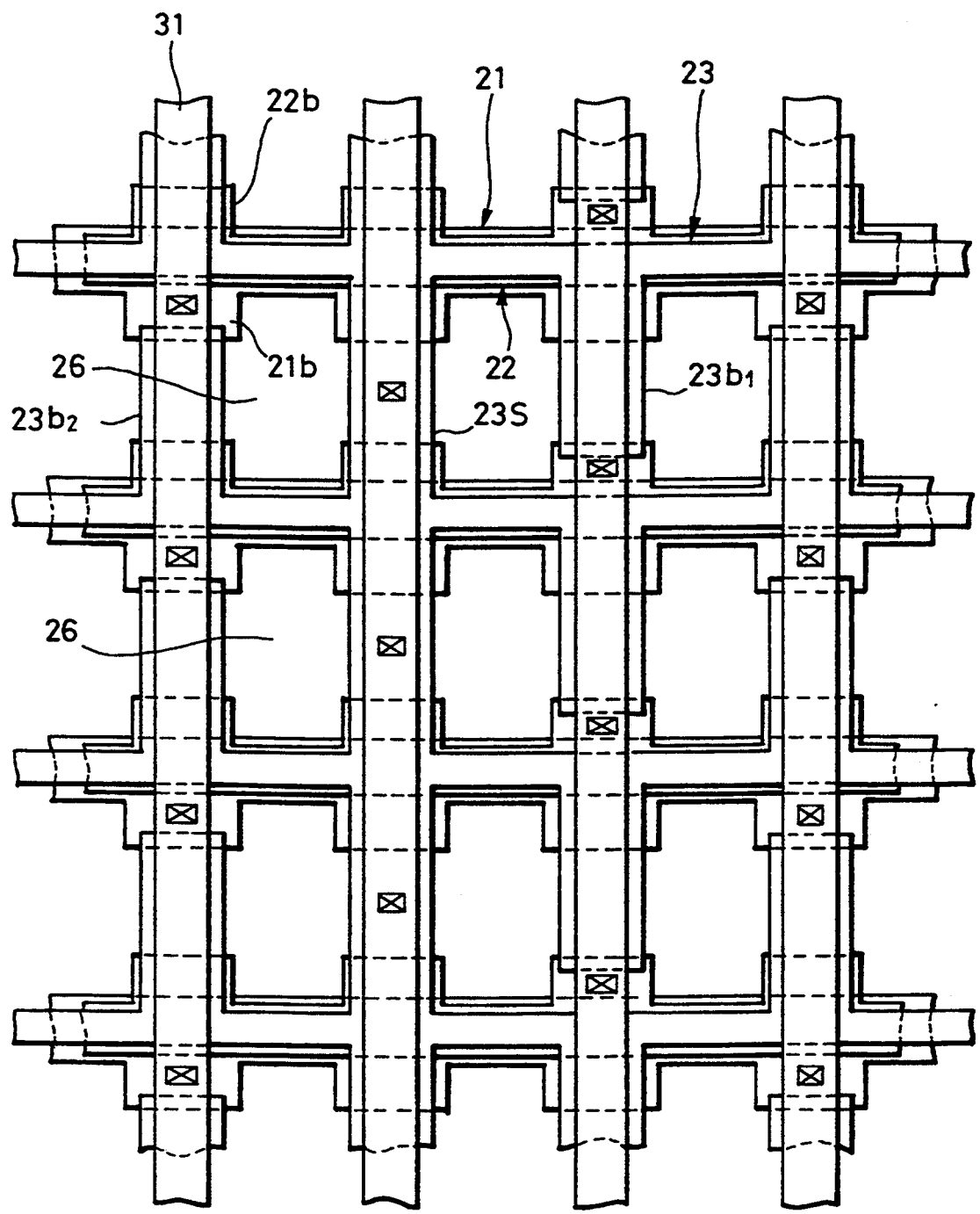
FIG. 4 is a plan view showing the wiring state of transfer electrodes according to another proposed example.
Figure 5:
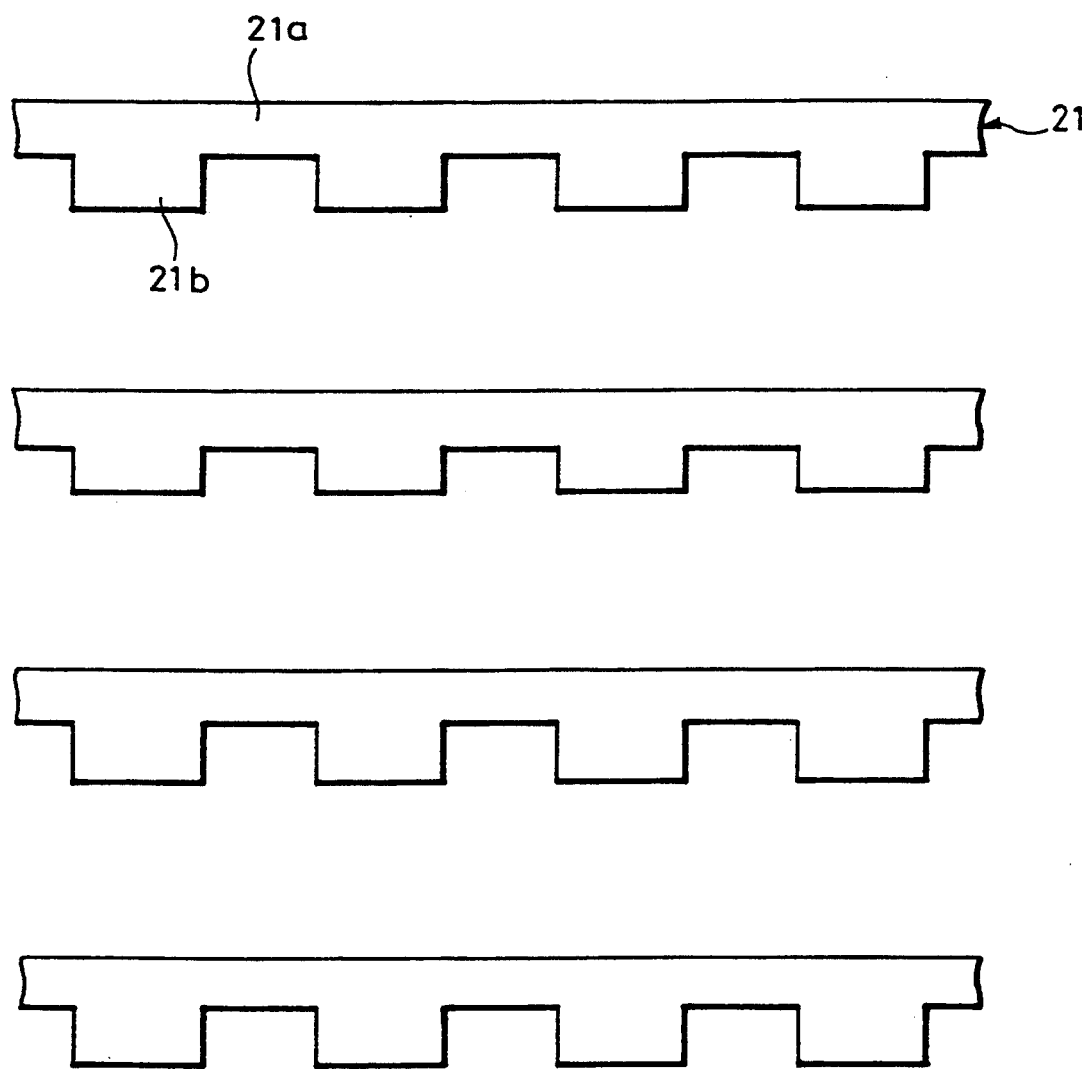
FIG. 5 is a plan view showing the pattern that a transfer electrode of a first layer according to other proposed example is formed.
Figure 6:
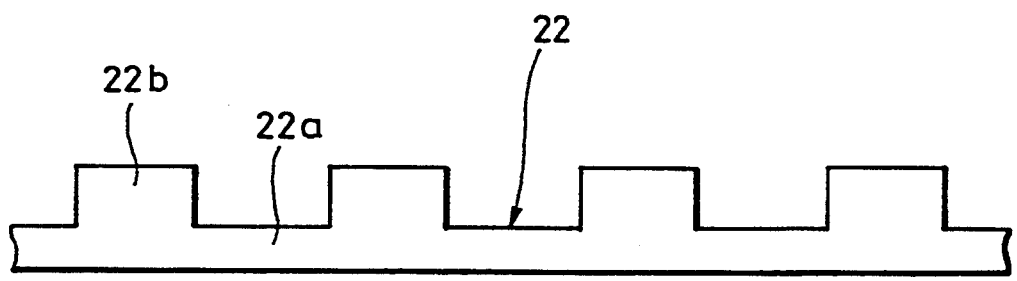
FIG. 6 is a plan view showing the pattern that a transfer electrode of a second layer according to other proposed example is formed.
Figure 6:
Figure 6:
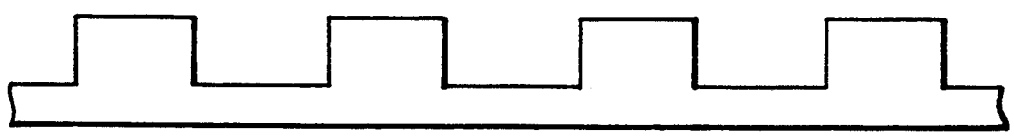
Figure 6:
Figure 7:
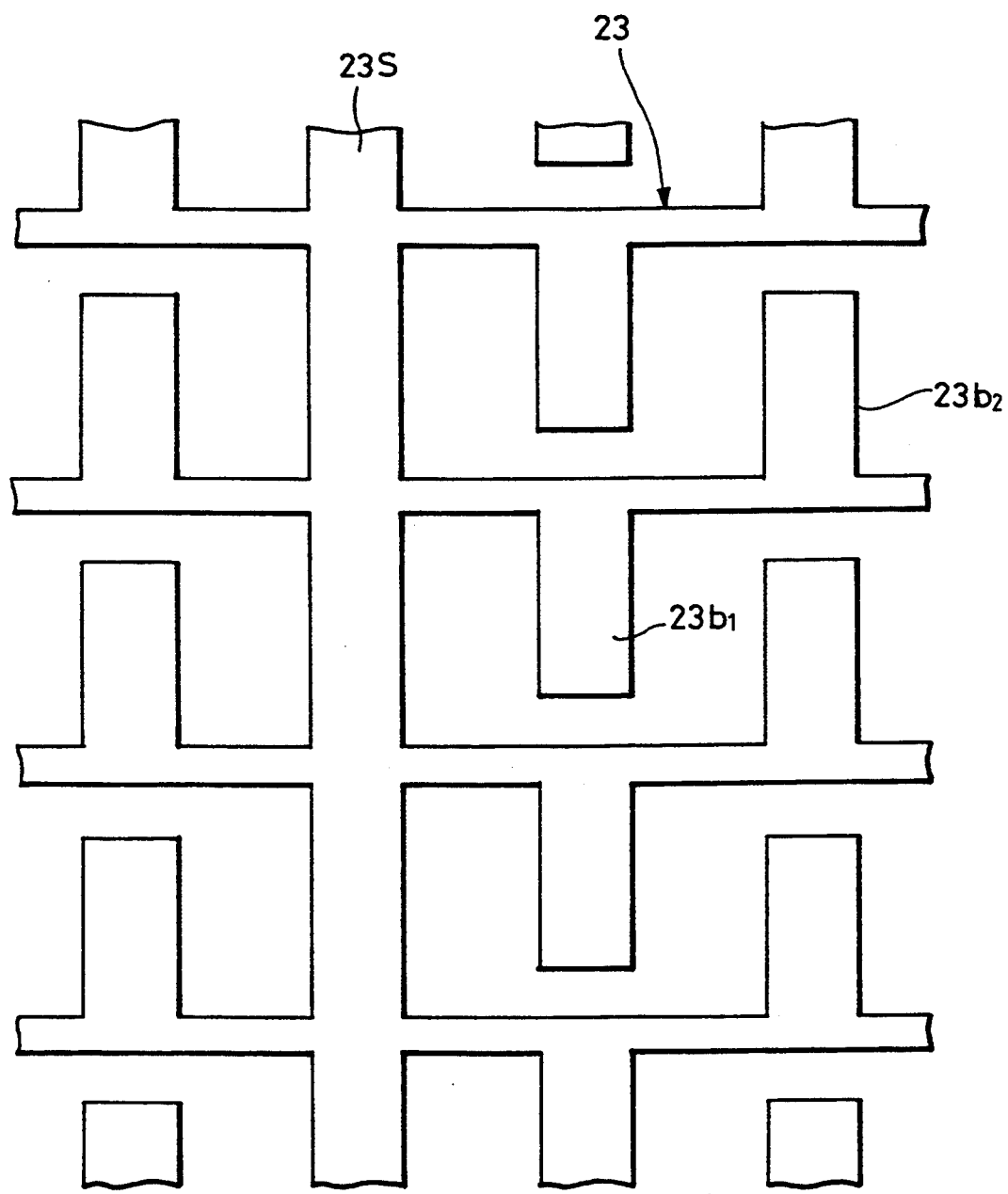
FIG. 7 is a plan view showing the pattern whereby a transfer electrode of a third layer according to another proposed example is formed.
Figure 8:
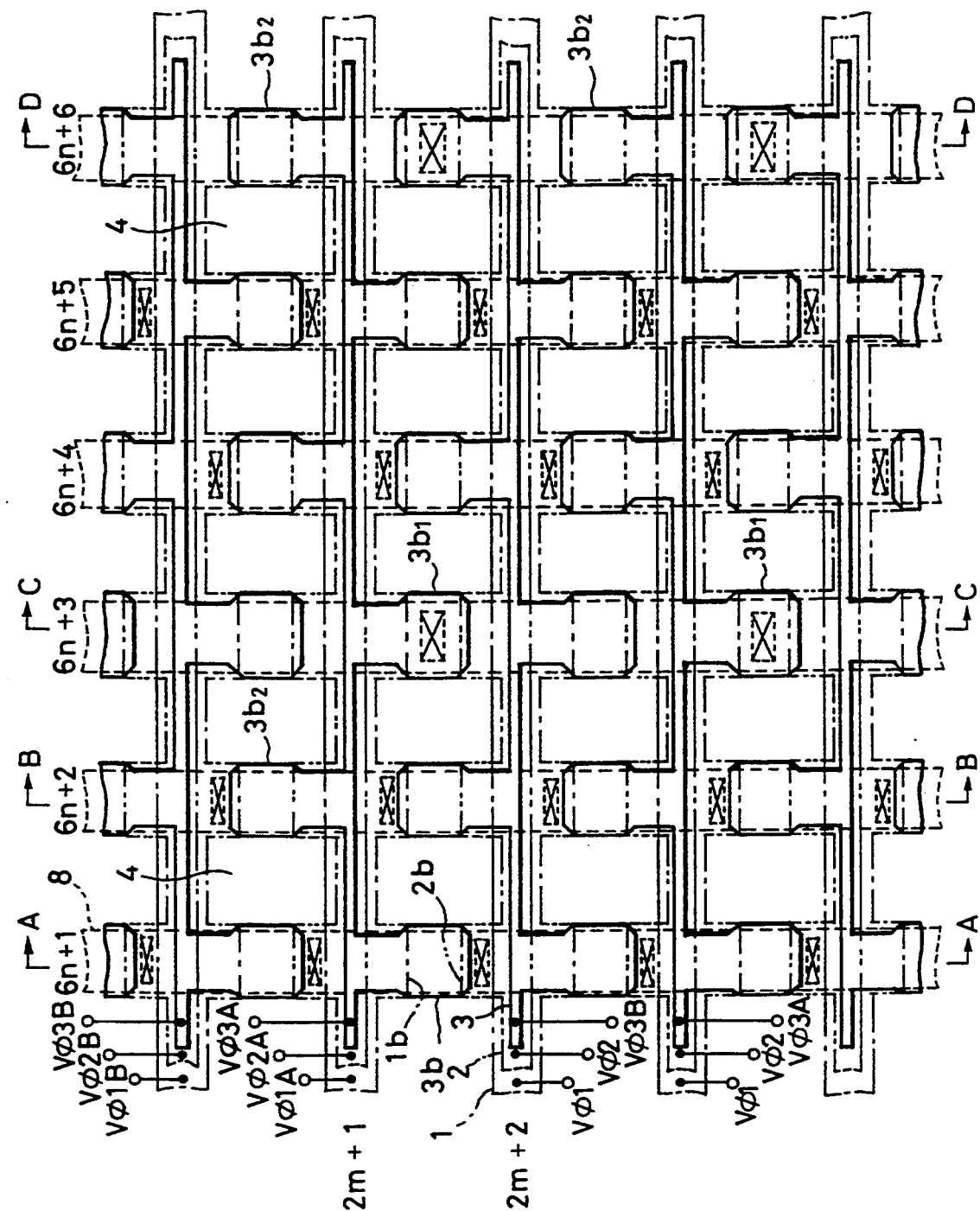
FIG. 8 is a plan view showing a main portion of a CCD solid state imager according to a first embodiment, in particular, the wiring state of transfer electrodes in an image region formed of light sensing units (pixels) arranged in a matrix fashion.
Figure 10:
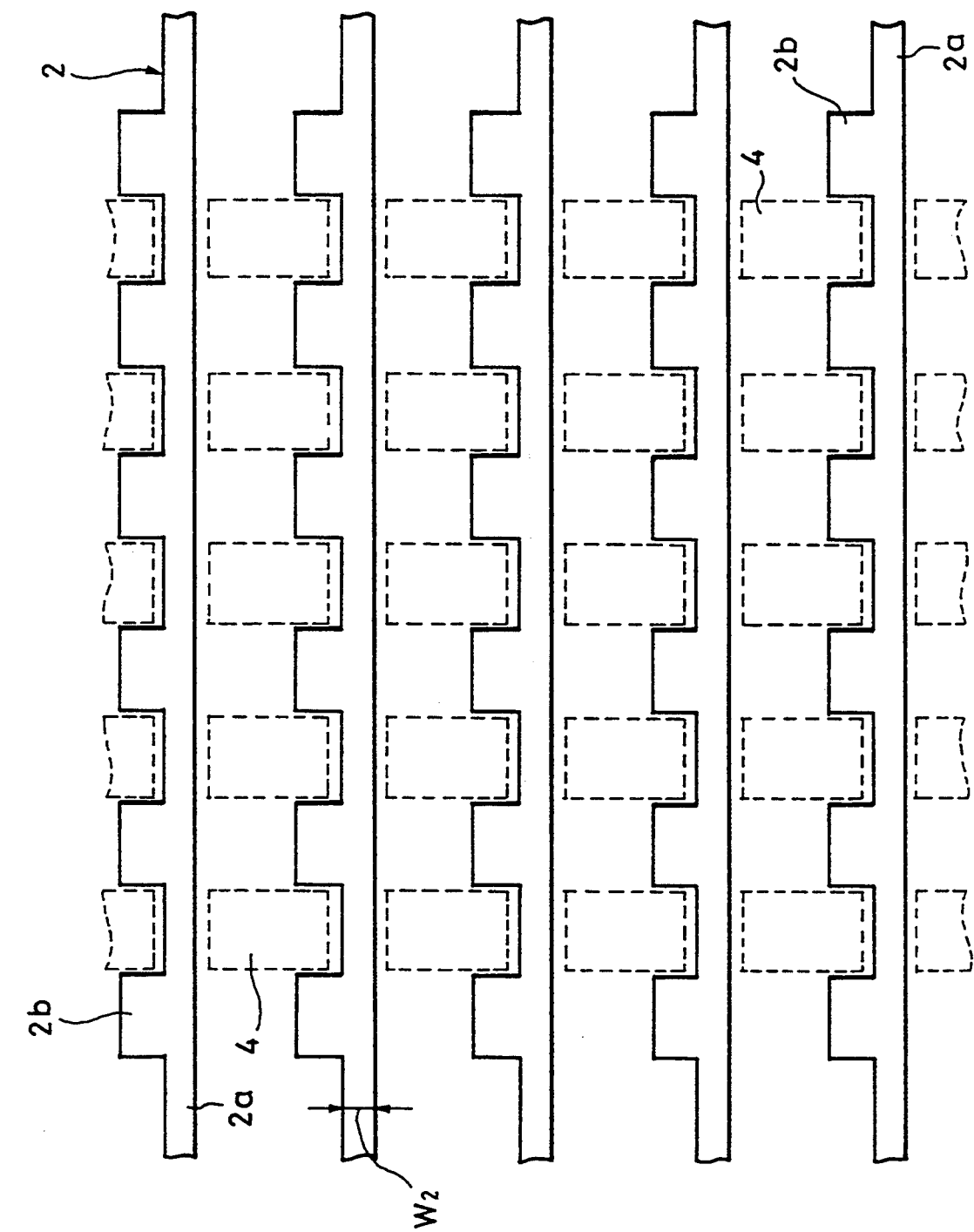
FIG. 10 is a plan view showing the pattern that a transfer electrode of a second layer according to the first embodiment is formed.
Figure 11:
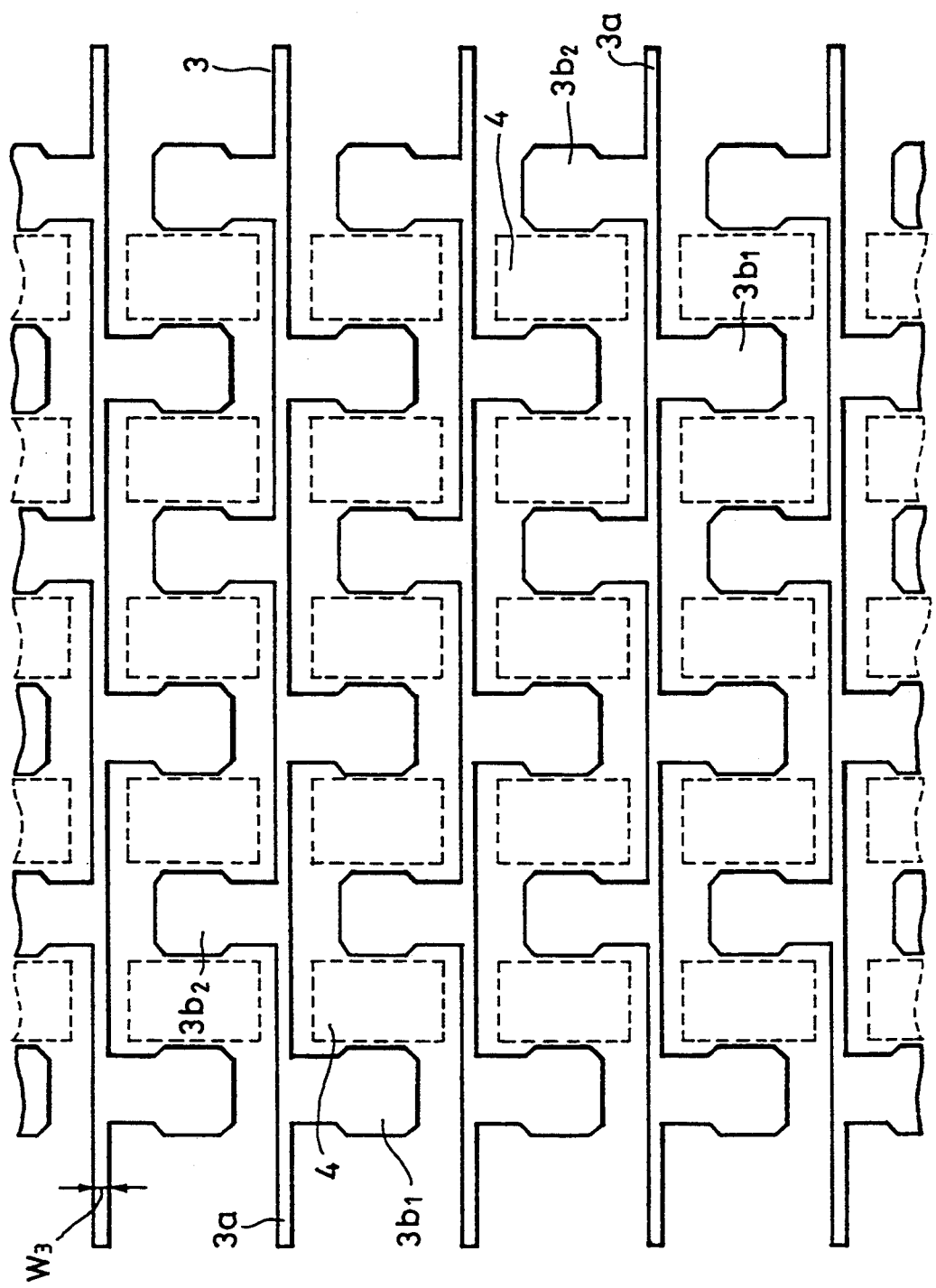
FIG. 11 is a plan view showing the pattern that a transfer electrode of a third layer according to the first embodiment is formed.
Figure 12A:
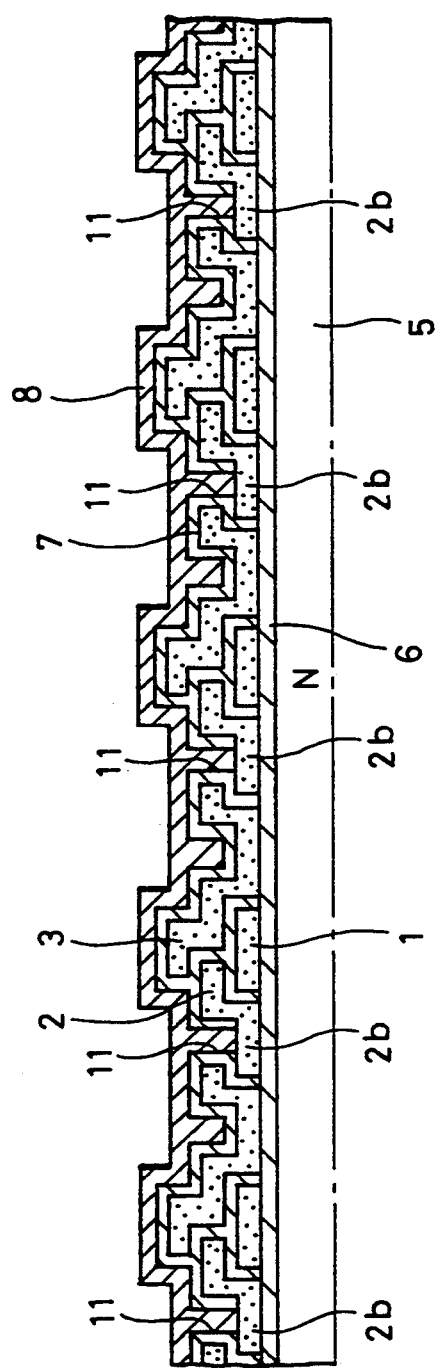
FIG. 12A is a cross-sectional view taken along the line A—A in FIG. 8.
Figure 12B:
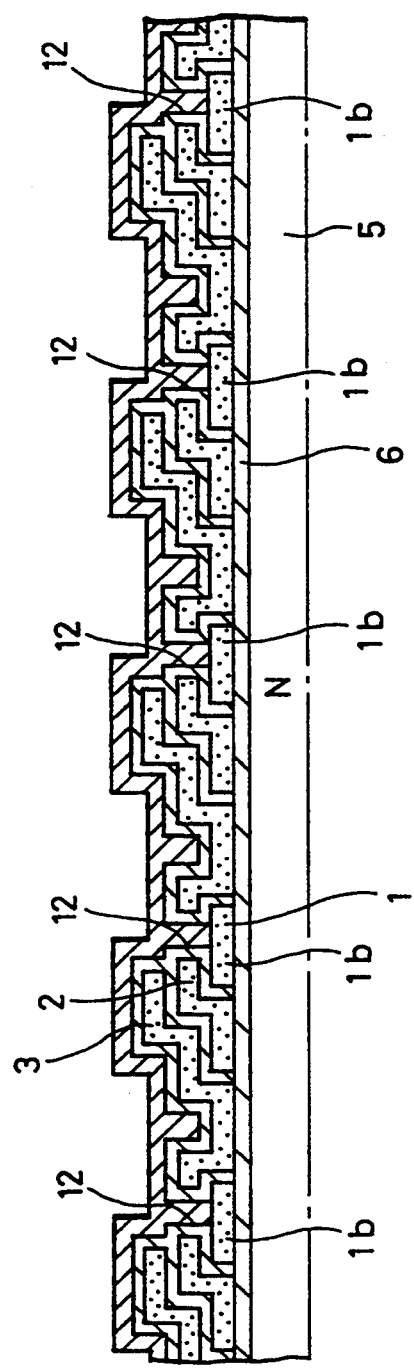
FIG. 12B is a cross-sectional view taken along the line B—B in FIG. 8.
Figure 13A:
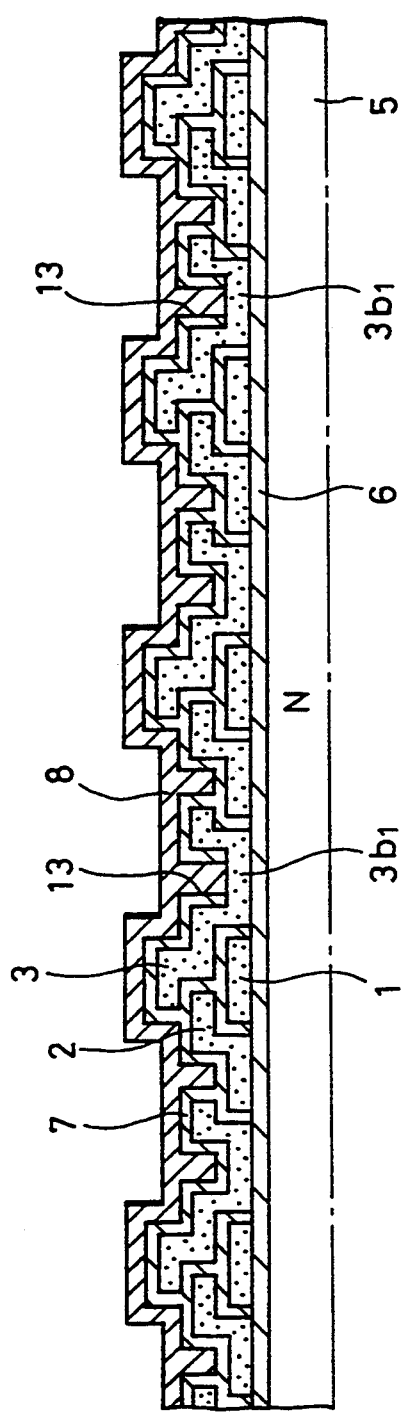
FIG. 13A is a cross-sectional view taken along the line C—C in FIG. 8.
Figure 13B:
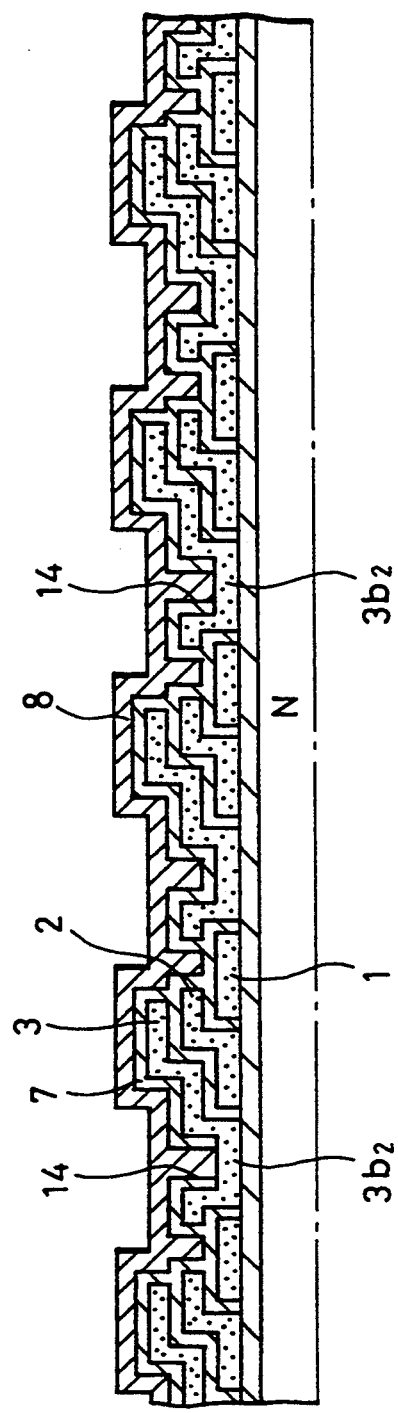
FIG. 13B is a cross-sectional view taken along the line D—D in FIG. 8.

FIG. 8 is a plan view showing a main portion of a CCD solid state imager according to a first embodiment, in particular, the wiring state of transfer electrodes in an image region formed of light sensing portions (pixels) arranged in a matrix fashion. FIG. 9 to FIGS. 12A, 12B are respectively plan views showing the patterns in which the transfer electrodes of the first to the third layers are formed. FIGS. 12A and 12B are cross-sectional views taken along the line A—A and the line B—B in FIG. 8. FIGS. 13A and 13B are cross-sectional views taken along the line C—C and D—D in FIG. 8, respectively.

As shown in FIG. 8, this CCD solid state imager includes transfer electrodes 1, 2, 3 of three layers. Generally, three-phase drive pulses having different phases are supplied to the respective transfer electrodes 1, 2, 3 so that the CCD solid state image sensor functions as a CCD image sensor of the full-pixel read-out system. In the figures, the respective transfer electrodes 1, 2, 3 are shown by a one-dot chain line, a two-dot chain line and a solid line, respectively.

As shown in FIGS. 12A and 12B which are cross-sectional views, for example, on a P-type well region (not shown) on an N-type silicon substrate, there are disposed a number of light sensing portions 4 (not shown in FIGS. 12A, 12B and shown in FIG. 8), each of which is formed of a photodiode, in a matrix fashion. Vertical registers 5, each being formed of an N-type impurity region and which extends in the vertical direction, are disposed between the light sensing portions 4. Then, the transfer electrodes 1, 2 and 3 formed of polycrystalline silicon layers of three layers are formed on the respective vertical registers 5.

Channel stopper regions and vertical registers are not shown in FIG. 8. In FIGS. 12A, 12B and FIGS. 13A, 13B, reference numeral 6 depicts a gate insulating layer (in this embodiment, a three-layer structure of $SiO_2$, SiN and $SiO_2$) and 7 an interlevel insulator.

Figure 9:
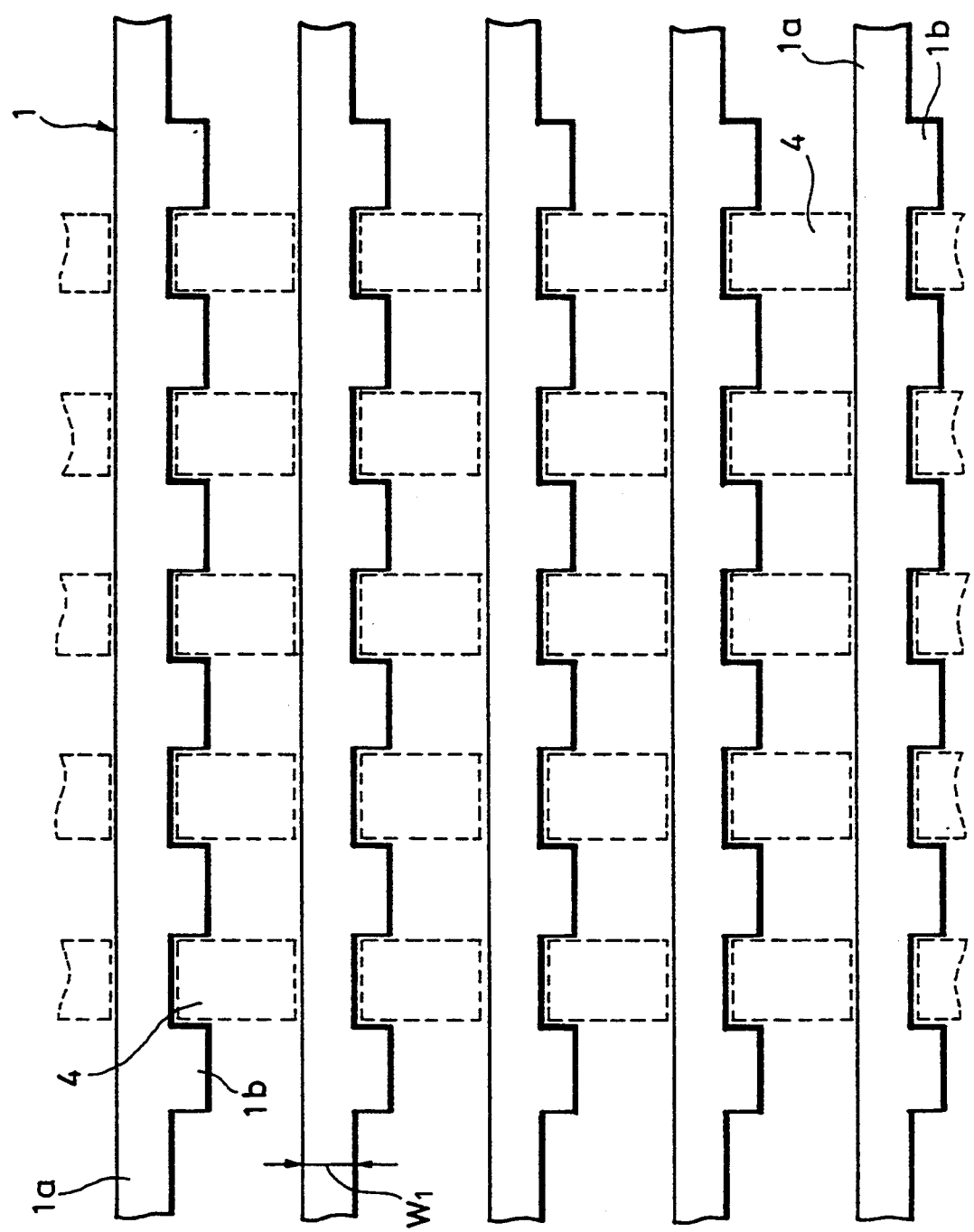
FIG. 9 is a plan view showing the pattern that a transfer electrode of a second layer according to the first embodiment is formed.

The patterns which form the transfer electrodes 1 and 2 will be described with reference to FIGS. 9 to 11. In FIGS. 9 to 11, a one-dot chain line regions depicts the light sensing portion 4.

As shown in FIG. 9, the transfer electrode 1 of first layer comprises a first leader portion $1a$ extending in the horizontal direction between the light sensing portions 4 and a first electrode portion $1b$ projects downwardly along the vertical register.

As shown in FIG. 10, the transfer electrode of the second layer comprises a second leader portion $2a$ extending in the horizontal direction between the light sensing portions 4 and a second electrode portion $2b$ which projects upwardly in the vertical direction.

The transfer electrode 3 of the third layer comprises, as shown in FIG. 11, a third leader portion $3a$ extending in the horizontal direction between the light sensing portions 4, a third first electrode portion $3b_1$ which extends downwardly along the vertical register in every odd column and a third second electrode portion $3b_2$ which extends upwardly along the vertical register in every even column. Leader portions $1a$, $2a$ and $3a$ of the respective transfer electrodes 1, 2 and 3 are set, so that the widths of the respective leader portions are $W_1 > W_2 > W_3$.

Then, the respective transfer electrodes 1, 2, 3 are respectively laminated and separated with interlevel insulators 7 and a shunt Al pattern 8 (shown by a broken line in FIG. 8) is formed along the vertical register so as to cover the electrode portions $1b$, $2b$, $3b_1$ and $3b_2$ of the respective transfer electrodes 1, 2 and 3, to form the pattern shown in FIG. 8.

According to this embodiment, the respective transfer electrodes 1, 2 and 3 and the Al pattern 8 are electrically connected as follows.

That is, with respect to the (6n+1)'th column and the (6n+5)'th column, as shown in the cross-sectional view of FIG. 12A, all second electrode portions $2b$ in the transfer electrode 2 of the second layer and the Al pattern 8 are connected through holes 11 formed through the interlevel insulator 7. With respect to the (6n+2)'th column and the (6n+4)'th column, as shown in the cross-sectional view of FIG. 12B, all first electrode portions $1b$ in the transfer electrode 1 of the first layer and the Al layer 8 are connected through holes 12 formed through the interlevel insulator 7.

With respect to the (6n+3)'th column and the (6n+6)'th column, the third electrode portions $3b_1$ and $3b_2$ in every row in the transfer electrode 3 of third layer and the Al layer 8 are connected. That is, with respect to the (6n+3)'th column, as shown in the cross-sectional view of FIG. 13A, the electrode portion (third first electrode portion $3b_1$) with respect to the (2m+1)'th row and the Al pattern 8 are connected through holes 13 formed through the interlevel insulator 7 but the third first electrode portion $3b_1$ with respect to the (2m+2)'th row is not connected thereto.

With respect to the (6n+6)'th column, as shown in the cross-sectional view of FIG. 13B, the third electrode portion (third second electrode portion $3b_2$) concerning the (2m+2)'th row and the Al pattern 8 are connected through holes 14 formed through the interlevel insulator 7 but the third second electrode portion $3b_2$ with respect to the (2m+1)'th row is not connected thereto. That is, the transfer electrode 3 of third layer on the two vertical registers disposed alternately and the Al pattern 8 are electrically connected in every row and in every two columns.

Figure 14:
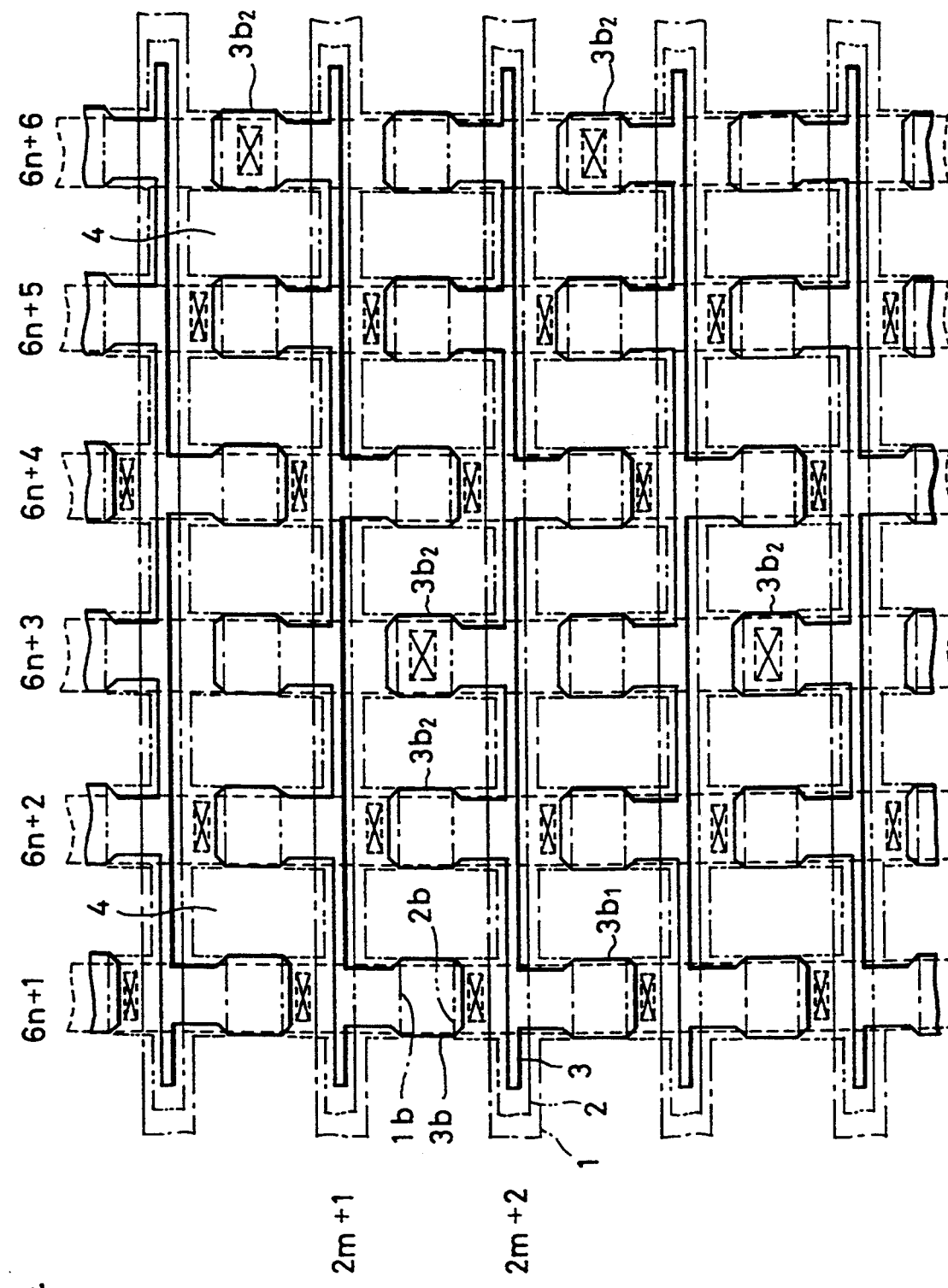
FIG. 14 is a plan view showing the state that transfer electrodes according to a modified example of the first embodiment are wired.
Figure 15:
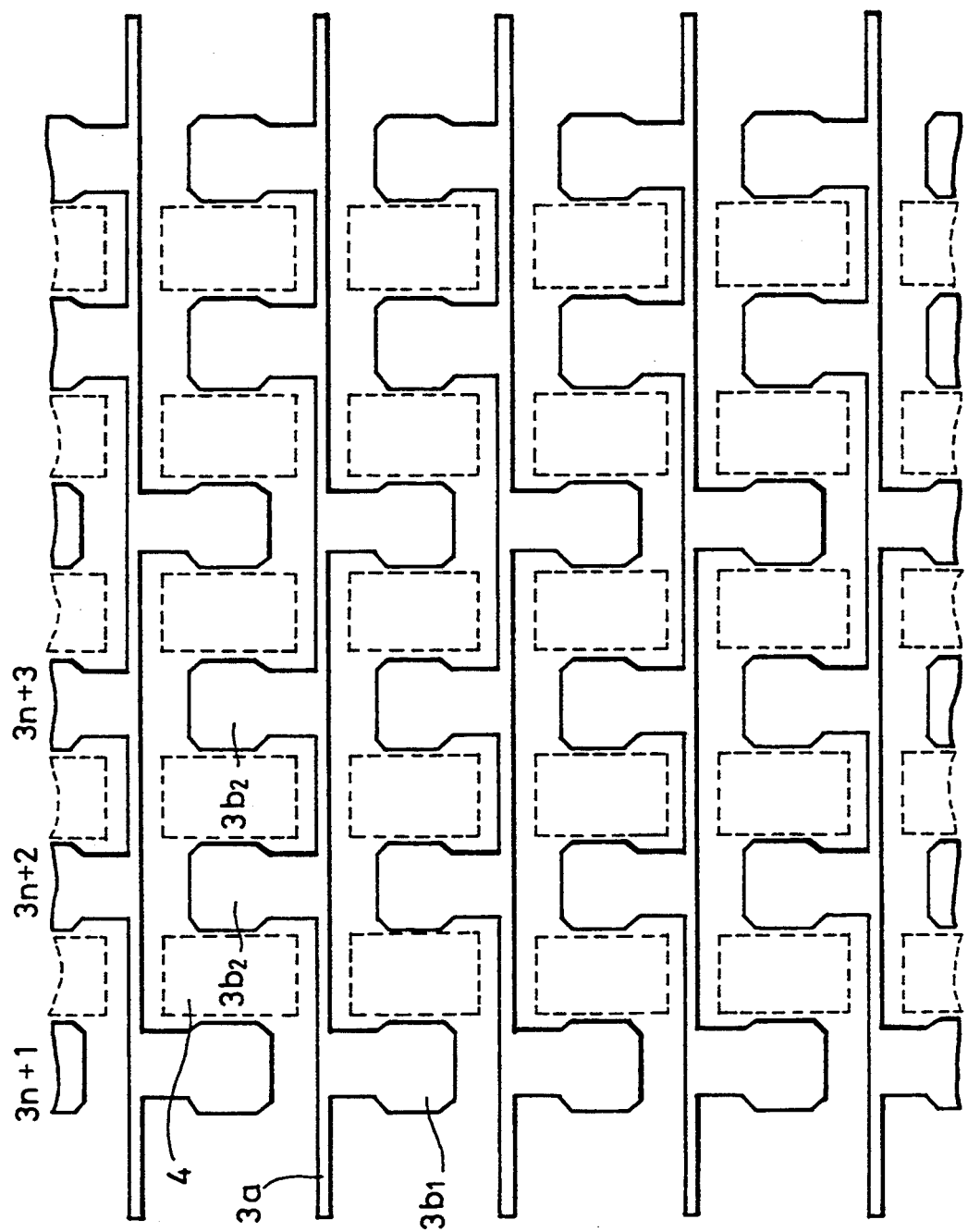
FIG. 15 is a plan view showing the pattern that a transfer electrode of a third layer according to the modified example of the first embodiment is formed.

A modified example of the first embodiment will be described with reference to FIGS. 14 and 15. FIG. 14 is a plan view showing the condition where the transfer electrodes are wired on the image region according to the modified example. FIG. 15 is a plan view showing the pattern that the transfer electrode 3 of the third layer is formed.

The CCD solid state image sensor according to this modified example has substantially the same structure as that of the first embodiment and is different in the a part of the formed pattern of the transfer electrode 3 of the third layer is different. That is, as shown in FIG. 15, the transfer electrode 3 of the third layer comprises a third leader portion $3a$ extending in the horizontal direction between the light sensing portions 4, the third first electrode portion $3b_1$ extends downwardly along the vertical register at the (3n+1)'th column and the third electrode portion $3b_2$ extends upwardly along the vertical register at the (3n+2)'th column and the (3n+3)'th column.

The respective transfer electrodes 1, 2 and 3 are sequentially laminated through the interlevel insulator 7 and the shunt pattern Al pattern 8 is formed along the vertical register in the vertical direction so as to cover the electrode portions $1b$, $2b$, $3b_1$ and $3b_2$ of the respective transfer electrodes 1, 2 and 3, so that the pattern shown in FIG. 14 is formed.

Also in this modified example, the electrical connection among the Al pattern 8 and the respective transfer electrodes 1, 2 and 3 is substantially the same as that of the first embodiment shown in FIG. 8, but differs only in that the pattern of the transfer electrode 3 of the third layer is as shown in FIG. 15. Therefore, with respect to the (6n+3)'th column, the transfer electrode (second electrode portion $3b_2$) of the third layer concerning the (2m+1)'th row and the Al pattern 8 is not connected and the transfer electrode (second electrode portion) of the third layer concerning the (2m+2)'th row and the Al pattern 8 are connected. With respect to the (6n+6)'th column, the transfer electrode (second electrode portion $3b_2$) of the third layer concerning the (2m+1)'th row and the Al pattern 8 are connected and the transfer electrode (second electrode portion $3b_2$) of the third layer concerning the (2m+2)'th row and the Al pattern 8 are not connected.

As described above, according to the first embodiment and the modified example thereof, the drive pulses having different phases can be supplied to the transfer electrode 3 of every third layer adjacent rows. As a result, quasi-4-phase driving can be effected, whereby the field read out operation and the frame read out operation can be carried out under the condition that signal charges from the light sensing portion 4 are read out under the transfer electrode 3 of the third layer.

An example where signal charges are transferred in the field read out system by the quasi-4-phase driving will be described with reference to FIGS. 16 to 19. In the figures, $V\phi1$ and $V\phi2$ depict drive pulses supplied to the transfer electrodes 1 and 2 of first and second layers independently of rows. $V\phi3A$ and $V\phi3B$ depict drive pulses supplied to the transfer electrode 3 of the third layer concerning the (2m+1)'th row and the (2m+2)'th row, respectively.

Figure 17:
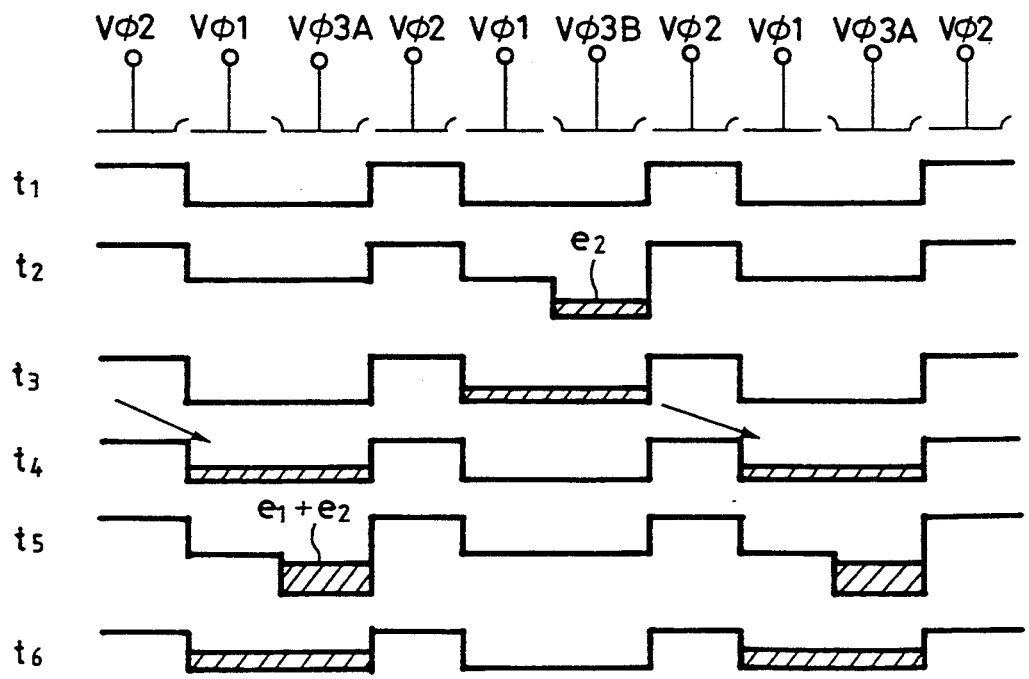
FIG. 17 is an operation conceptual diagram showing the state that electric charges are transferred in the first field according to the first embodiment.
Figure 19:
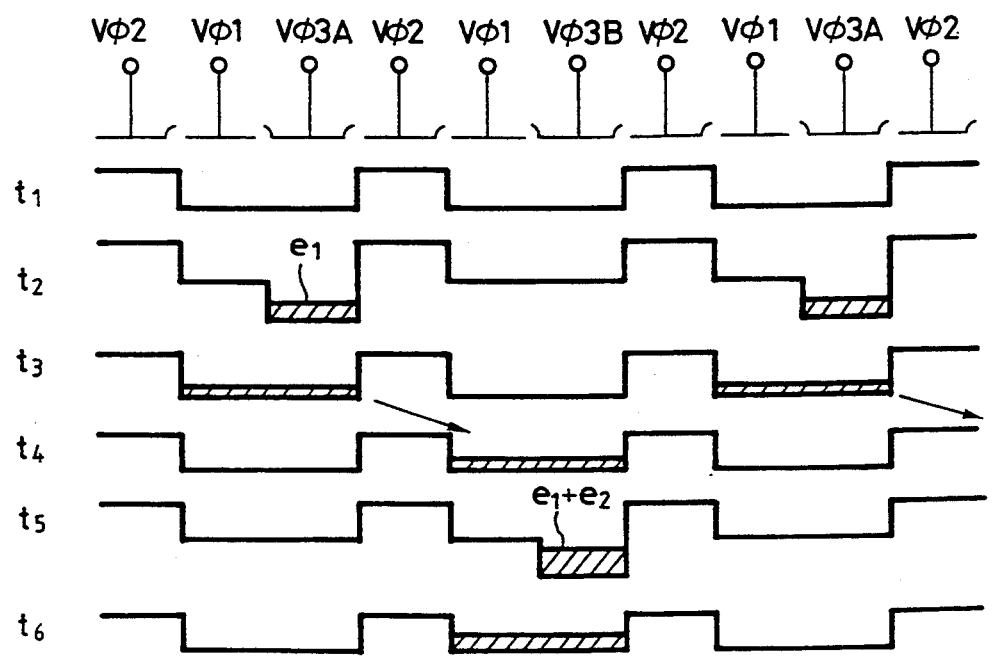
FIG. 19 is an operation conceptual diagram showing the state that electric charges are transferred in the second field according to the first embodiment.

In the first embodiment and the modified example thereof, the formed patterns of the third electrode 3 concerning the (6n+1)'th column and the (6n+2)'th column are different but the transferred states of signal charges in the respective columns are the same. Therefore, FIGS. 17 and 19 shows typically transfer states of signal charges concerning the (6n+1)'th column of the first embodiment.

Initially, the first field will be described with reference to FIGS. 16 and 17. At a time $t_1$, $V\phi1$, $V\phi2$, $V\phi3A$ and $V\phi3B$ are respectively at high level, low level, high level and at high level so that potential wells are continuously formed under the transfer electrodes 1 and 3 of the first and the third layers.

At the next time $t_2$, $V\phi3B$ goes to read-out level (level higher than the above high level) so that a signal charge $e_2$ from the light sensing portion 4, particularly, the light sensing portion 4 concerning the (2m+2)'th row is transferred to and accumulated under the transfer electrode 3 of third layer concerning (2m+2)'th row.

At the next timing $t_3$, $V\phi3B$ is generally changed to high level so that the signal charge $e_2$ is transferred to and accumulated in the potential wells continuously formed under the transfer electrodes 1 and 3 of the first and the third layers.

During an interval T, three-phase drive pulses $V\phi1$ to $V\phi3$ ($V\phi3A$, $V\phi3B$) having different phases are respectively supplied to the transfer electrodes 1 to the 3 of the first to third layers, whereby at the next time $t_4$, the signal charge $e_2$ is transferred to and accumulated in the potential wells continuously formed under the transfer electrodes 1 and 3 of the first and the third layers on the next row.

At the next time $t_5$, $V\phi3A$ goes to read-out level so that a signal charge $e_1$ from the light sensing portion 4, particularly, the light sensing portion 4 with respect to the (2m+1)'th row is transferred to and accumulated under the transfer electrode 3 of the third layer concerning the (2m+1)'th row, thereby being mixed with the signal charge concerning the (2m+2)'th row. More precisely, the signal charge concerning the (3m+20'th row and the signal charge concerning (3m+3)'th row are mixed.

At the next time $t_6$, $V\phi3A$ is generally changed to high level so that a mixed signal charge ($e_1+e_2$) is transferred to and accumulated in the potential wells continuously formed under the transfer electrodes 1 and 3 of the first and the third layers.

Thereafter, the three-phase drive pulses $V\phi1$ to $V\phi3$ ($V\phi3A$, $V\phi3B$) having different phases are respectively supplied to the respective transfer electrodes 1, 2 and 3, thereby sequentially supplying the signal charge ($e_1$ and $e_2$) to the horizontal register side.

The second field will be described with reference to FIGS. 18 and 19. Initially, at time $t_1$, $V\phi1$, $V\phi2$, $V\phi3A$ and $V\phi3B$ are respectively at high level, low level, high level and at high level so that potential wells are continuously formed under the transfer electrodes 1 and 3 of the first and third layers.

At the next time $t_2$, $V\phi3A$ goes to read-out level so that the signal charge $e_1$ from the light sensing portion 4, particularly, the light sensing portion 4 concerning the (2m+1)'th row is transferred to and accumulated under the transfer electrode 3 of the third layer concerning the (2m+1)'th row.

At the next time $t_3$, $V\phi3A$ is changed to general high level so that the signal charge $e_1$ is transferred to and accumulated in the potential wells continuously formed under the transfer electrodes 1 and 3 of the first and the third layers.

During the interval T, three-phase drive pulses $V\phi1$ to $V\phi V3$ ($V\phi3A$, $V\phi3B$) having different phases are respectively supplied to the transfer electrodes 1 to 3 of the first to third layers. Thus, at the next time $t_4$, the signal charge $e_1$ is transferred to and accumulated in the potential wells continuously formed under the transfer electrodes 1 and 3 of the first and third layers as shown by arrows, respectively.

At the next time $t_5$, $V\phi3B$ goes to read-out level so that the signal charge $e_2$ from the light sensing portion 4, particularly, the light sensing portion 4 concerning the (2m+2)'th row is transferred to and accumulated under the transfer electrode 3 of the third layer concerning the (2m+1)'th row. More precisely, the signal charge concerning the (3m+1)'th row and the signal charge concerning the (3m+2)'th row are mixed with each other.

At the next time $t_6$, $V\phi3A$ is changed to the ordinary high level so that the mixed signal charge ($e_1+e_3$) is transferred to and accumulated in the potential wells continuously formed under the transfer electrodes 1 and 3 of the first and third layers.

Thereafter, the three-phase drive pulses $V\phi1$ to $V\phi3$ having different phases ($V\phi3A$, $V\phi3B$) are respectively supplied to the transfer electrodes 1, 2 and 3, thereby sequentially transferring the signal charge ($e_1+e_2$) to the horizontal register side.

Figure 16:
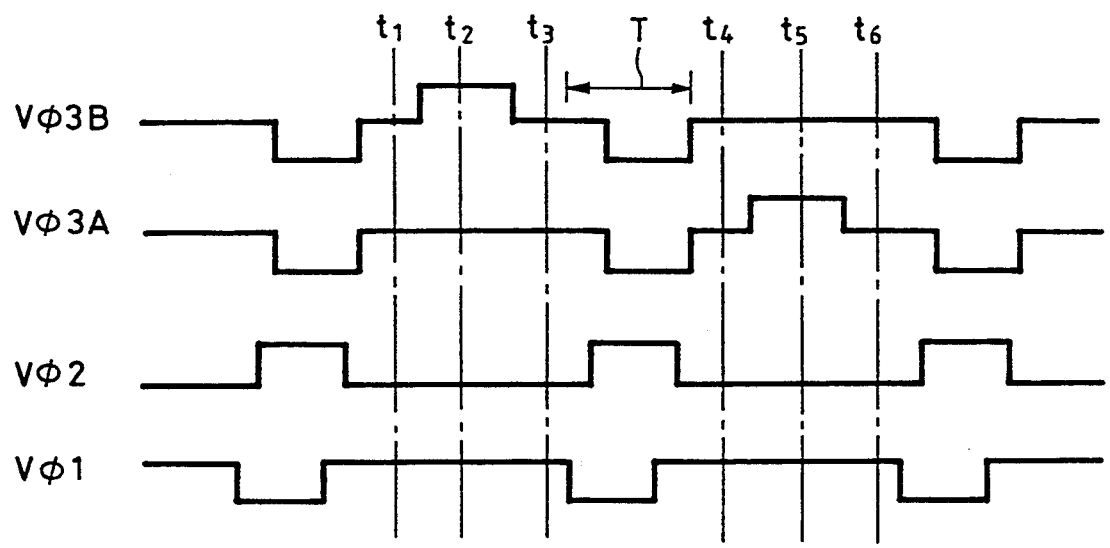
FIG. 16 is a timing chart showing output timings of drive pulses in the first field according to the first embodiment.
Figure 18:
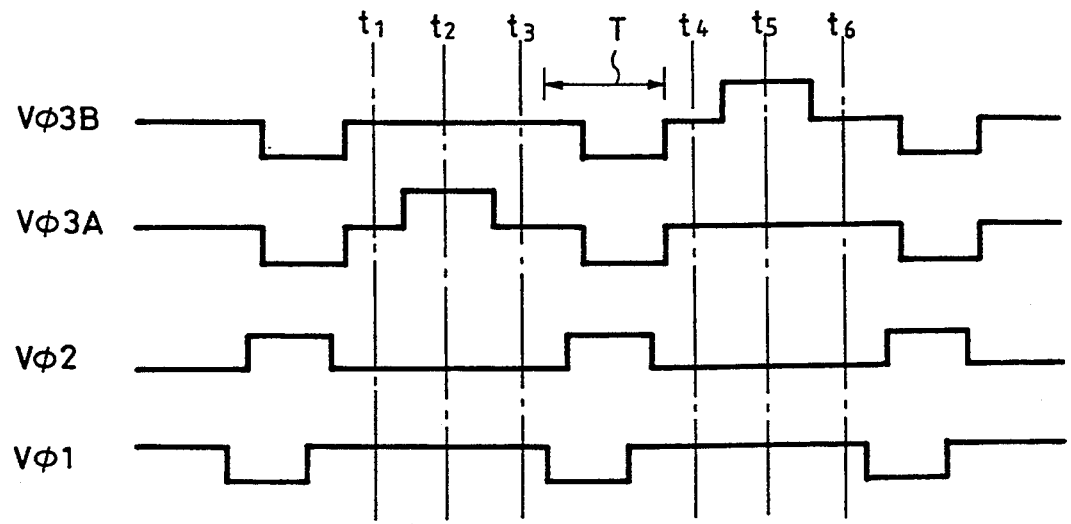
FIG. 18 is a timing chart showing output timings of drive pulses in the second field according to the first embodiment.

The frame read-out operation can be realized such that $V\phi3A$ and $\phi3B$ are not changed to the read-out level but changed to the ordinary high level at time $t_5$ in the first and second fields as shown in FIGS. 16 and 18.

As described above, with the structures of the first embodiment and the modified example, i.e., since the electrical connection between the transfer electrode 3 of the third layer and the Al pattern 8 on the vertical registers disposed at every two rows is effected in every other one within the same column, the full pixel read-out system corresponding to the non-interlace system and the field read-out system or field read-out system corresponding to the interlace system can be easily achieved.

Further, since the electrical connection between the transfer electrode 3 of third layer and the Al pattern 8 is alternately effected in every two columns, a shunt for the transfer electrode 3 of third layer to which V$\phi$3A is supplied and the transfer electrode 3 of third layer to which V$\phi$3B is supplied by the Al pattern 8 can be uniformly carried out.

However, the video signal read-out according to this embodiment is displaced in the horizontal direction because the transfer electrodes of third layers provided as read-out electrodes are disposed alternately. An embodiment that can solve the aforesaid problem will be described below as a second embodiment of the present invention.

The CCD solid state imager according to the second embodiment of the present invention will hereinafter be described with reference to FIGS. 20 to 25. In the second embodiment, like parts corresponding to those of the first embodiment are marked with the same references and therefore will not be described in detail.

The CCD solid state imager according to the second embodiment has substantially the same structure as that of the first embodiment and differs in the connections between the transfer electrodes 1, 2, 3 and the Al pattern 8.

Figure 20:
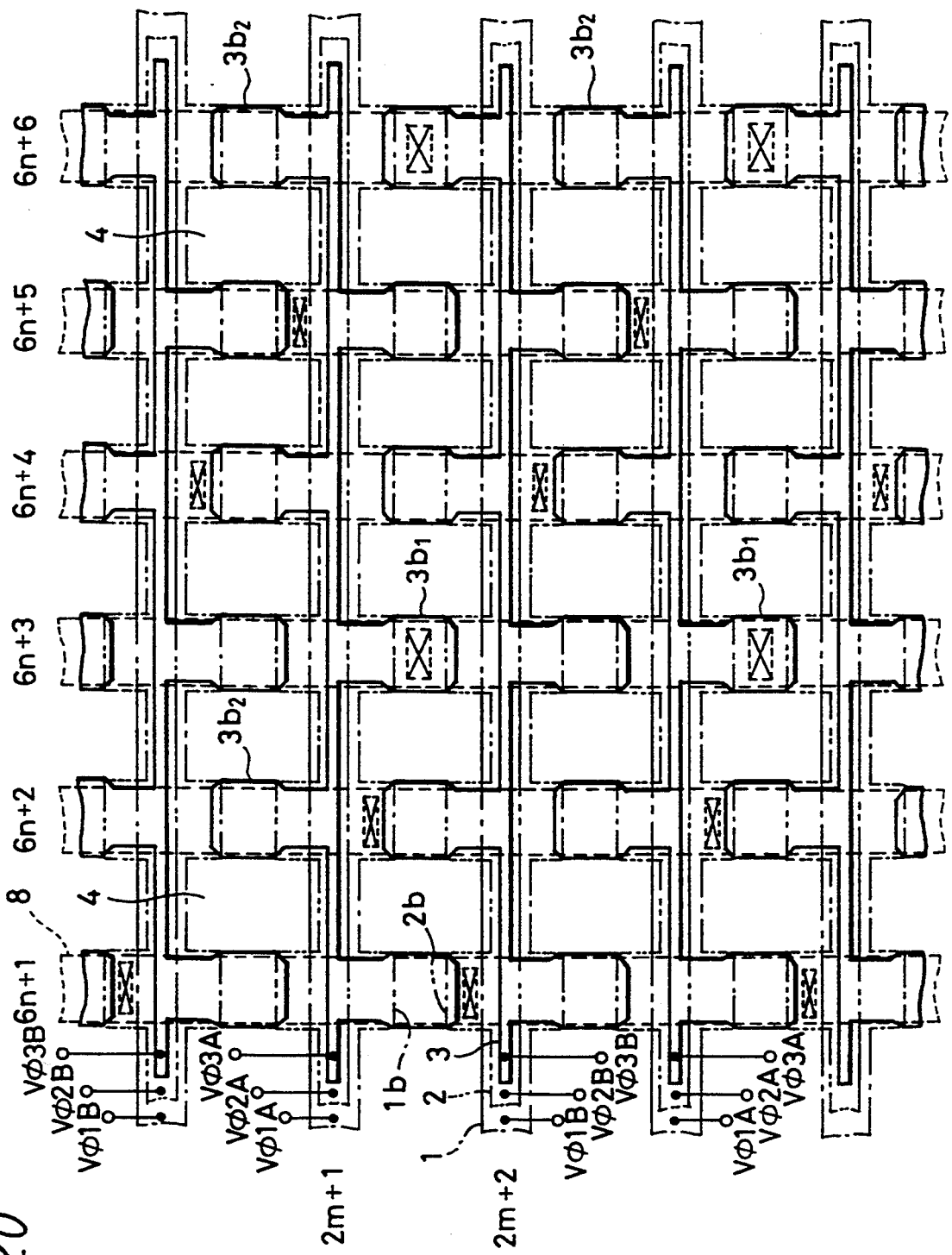
FIG. 20 is a plan view showing the state that transfer electrodes according to a second embodiment are wired.

As shown in FIG. 20, with respect to the (6n+1)'th column and the (6n+5)'th column, the second electrode portions 2b disposed in every row in the transfer electrode 2 of second layer and the Al pattern 8 are connected through holes formed through the interlevel insulator. That is, with respect to the (6n+1)'th column, the second electrode portion 2b concerning the (2m+1)'th row and the Al pattern are not connected but the second electrode portion 2b concerning the (2m+2)'th row is connected to the the Al pattern 8.

With respect to (6n+5)'th column, the second transfer electrode portion 2b concerning the (2m+1)'th row and the Al pattern 8 are connected and the second electrode portion 2b concerning the (2m+2)'th row is not connected to the Al pattern 8. That is, the electrical connection between the transfer electrode 2b of the second layer on the vertical registers disposed in every two rows and the Al pattern 8 is realized alternately in every two columns.

With respect to the (6n+2)'th column and the (6n+4)'th column, the first electrode portions 1b disposed in every row in the transfer electrode 1 of the first layer and the Al pattern 8 are connected through holes formed through the interlevel insulator. More specifically, with respect to the (6n+2)'th column, the first electrode portion 1b concerning the (2m+1)'th row and the Al pattern 8 are connected but the first electrode porion 1b concerning the (2n+2)'th row is not connected to the Al pattern 8.

With respect to the (6n+4)'th column, the first electrode portion 1b concerning the (2m+1)'th row and the Al pattern 8 are not connected but the first electrode portion 1b concerning the (2m+2)'th row is connected to the Al pattern 8. Also in this case, the electrical connection between the transfer electrodes 1 of the first layer on the vertical registers disposed in every two rows and the Al pattern is alternately realized in every two columns.

With respect to the (6n+3)'th column and the (6n+6)'th column, the third electrode portions 3$b_1$ and 3$b_2$ disposed at every row in the transfer electrode 3 of third layer and the Al pattern 8 are connected through holes formed on the interlevel insulator. That is, with respect to the (6n+3)'th column, the third electrode portion 3$b_1$ concerning the (2n+1)'th row and the Al pattern 8 are connected and the third first electrode portion 3$b_1$ concerning the (2m+2)'th row is not connected to the Al pattern 8.

With respect to the (6n+6)'th column, the third second electrode portion 3$b_2$ concerning the (2m+1)'th row and the Al pattern 8 are connected and the third second electrode portion 3$b_2$ concerning the (2m+1)'th row is not connected thereto. Also in this case, the electrical connection between the transfer electrodes 3 of third layer on the vertical registers disposed in every two row and the Al pattern 8 is realized alternately in every two columns.

Figure 21:
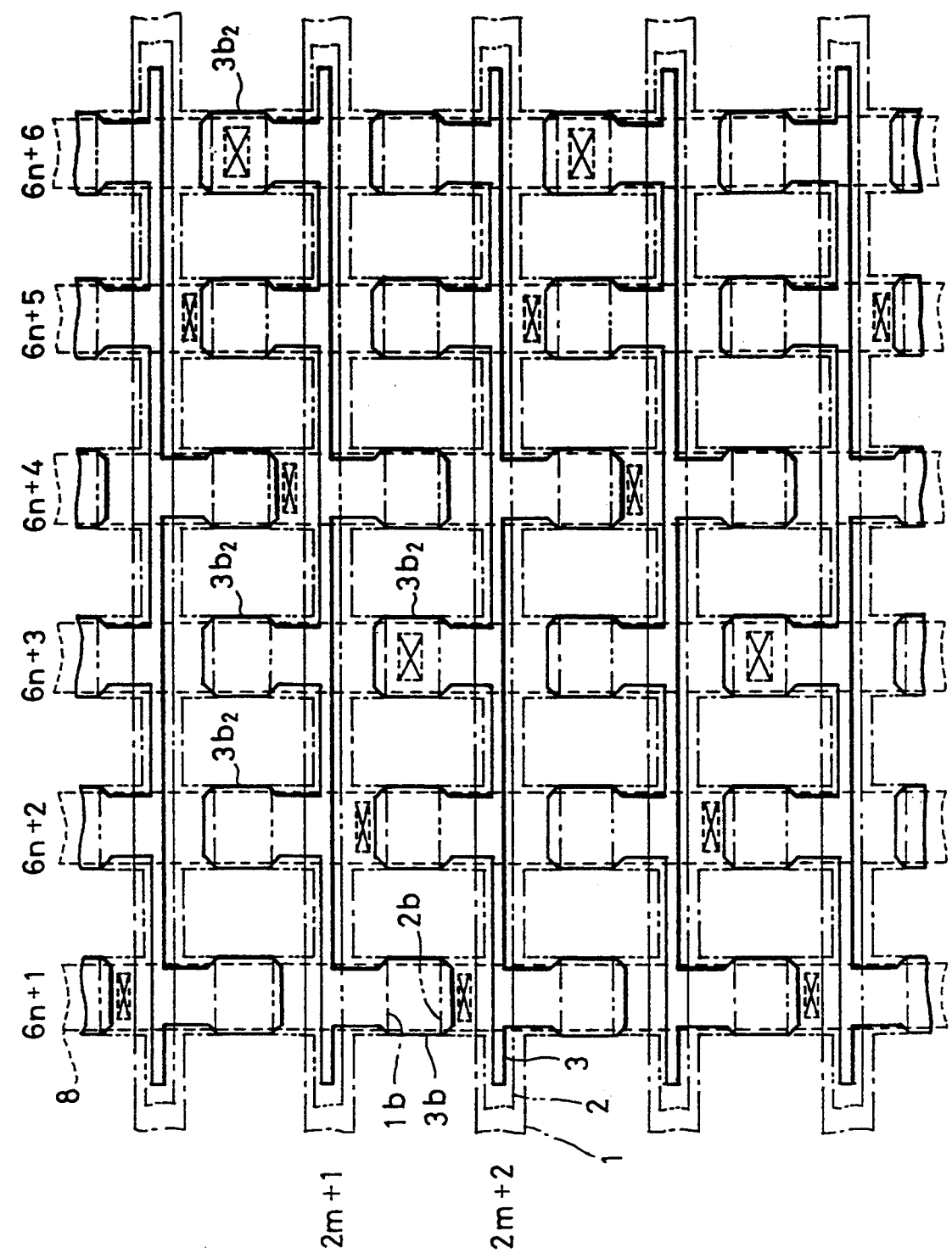
FIG. 21 is a plan view showing the state that transfer electrodes according to a modified example of the second embodiment are wired.

A modified example of the second embodiment will be described with reference to FIG. 21. The CCD solid state imager according to this modified example has substantially the same structure as that of the modified example of the first embodiment and is different in the connected state of the transfer electrodes 1, 2, 3 and the Al pattern 8. This connected state is substantially the same as that of the second embodiment and will not be described in detail. However, this connected state is different only in that the formed pattern of the transfer electrode 3 of third layer is presented as is shown in FIG. 15. Therefore, with respect to the (6n+3)'th column, the transfer electrode (second electrode portion 3$b_2$) of the third layer concerning the (2m+1)'th row and the Al pattern 8 are not connected, but the transfer electrode (second electrode portion 3$b_2$) of third layer concerning the (2m+2)'th row and the Al pattern 8 are connected. With respect to the (6n+6)'th column, the transfer electrode (second electrode portion 3$b_2$) of the third layer concerning the (2m+2)'th row and the Al pattern 8 are connected but the transfer electrode (second electrode portion 3$b_2$) of the third layer concerning the (2m+2)'th row and the Al pattern 8 are not connected.

According to the second embodiment and the modified example thereof, the drive pulses having different phase can be supplied to the transfer electrodes 1 to 3 of the first to third layers. That is, the drive pulses having different phases can be supplied to the same transfer electrode so that the field read-out operation and the frame read-out operation can be easily realized without decreasing the amount of electric charges handled by the vertical registers.

An example where signal charges are transferred in the field read-out system by the quasi-six-phase driving will be described below with reference to FIGS. 22 to 25. In the figures, V$\phi$1A, V$\phi$2A and V$\phi$3A depict drive pulses that are supplied to the transfer electrodes 1, 2 and 3 of first, second and third layers concerning the (2m+1)'th row. V$\phi$1B, V$\phi$2B and V$\phi$3B depict drive pulses that are supplied to the transfer electrodes 1, 2 and 3 of the first, second and third layers concerning the (2m+2)'th row.

Also in this case, the formed patterns of the third transfer electrode 3 concerning the (6n+1)'th column and the (6n+2)'th column are different but the transferred states of signal charges in the respective columns are the same. Therefore, FIGS. 23 and 25 typically show the transferred states of signal charges concerning the (6n+2)'th column of the second embodiment.

Initially, the first field will be described with reference to FIGS. 22 and 23. At a time $t_1$, only $V\phi 1A$ and the $V\phi 2A$ is at low level and other driving pulses are at high level so that the potential wells are continuously formed from under the transfer electrode 3 of the third layer concerning the (2m+1)'th row so as to under the transfer electrode 3 of the third layer concerning the (2m+2)'th row.

At the next time $t_2$, $V\phi 3A$ and $V\phi 3B$ go to the read-out level so that the signal charges $e_1$ and $e_2$ from the light sensing portion 4 concerning the (2m+1)'th row and the (2m+2)'th row are transferred to and accumulated under the transfer electrodes 3 of the corresponding third layers.

At timing $t_4$, since $V\phi 3A$ and $V\phi 3B$ are changed to low level, the signal charges $e_1$ and $e_2$ are accumulated in potential wells continuously formed under the transfer electrode 1 of the first layer concerning the (2m+2)'th row and under the transfer electrode 2 of the second layer concerning the (2m+2)'th row, thereby the signal charges $e_1$ and $e_2$ concerning the (2m+1)'th row and the (2m+2)'th row being mixed.

Thereafter, three-phase drive pulses having different phases ($V\phi 1A$, $V\phi 2A$, $V\phi 3A$, $V\phi 1B$, $V\phi 2B$ and $V\phi 3B$) are supplied to the respective transfer electrodes 1, 2 and 3, thereby the signal charge ($e_1+e_2$) being sequentially supplied to the horizontal register side.

The second field will be described with reference to FIGS. 24 and 25. Initially, at a time $t_1$, since $V\phi 1B$ and $V\phi 2B$ are at low level and the other drive pulses are at high level, the potential wells are continuously formed over the under side of the transfer electrode 3 of third layer concerning the (2m+1)'th row to the under side of the transfer electrode 3 of third layer concerning the (2m+2)'th row.

At the next time $t_1$, $V\phi 3A$ goes to the read-out level so that the signal charge $e_1$ from the light sensing portion 4 is transferred to and accumulated under the transfer electrode 3 of the corresponding third layer.

At a time $t_3$, $V\phi 3B$ goes to the read-out level so that the signal charge $e_2$ is transferred to and accumulated under the transfer electrode 3 of the corresponding third layer.

At a time $t_4$, $V\phi 3A$ and $V\phi 3B$ are changed to low level so that the signal charge ($e_1+e_2$) is accumulated under the transfer electrode 1 of the first layer concerning the (2m+2)'th row and under the transfer electrode 2 of second layer, thereby the signal charges $e_1$ and $e_2$ concerning the (2m+1)'th row and the (2m+2)'th row being mixed.

Thereafter, the three-phase drive pulses ($V\phi 1A$, $V\phi 2A$, $V\phi 3A$, $V\phi 1B$, $V\phi 2B$ and $V\phi 3B$) having different phases are respectively supplied to the respective electrodes 1, 2 and 3, thereby sequentially transferring the signal charge ($e_1+e_2$) to the horizontal register side.

The second field will be described with reference to FIGS. 24 and 25. Initially, at a time $t_1$, $V\phi 1B$ and $V\phi 2B$ are at low level and the other drive pulses are at high level so that potential wells are continuously formed from the under side of the transfer electrode 3 of third layer concerning the (2m+1)'th row to the under side of the transfer electrode 3 of third layer concerning the (2m+2)'th row.

At the next time $t_2$, $V\phi 3A$ goes to the read-out level and the signal charge $e_1$ from the light sensing portion 4 is transferred to and accumulated under the transfer electrode 3 of the corresponding third layer.

At the next time $t_3$, $V\phi 3B$ goes to the read-out level and the signal charge $e_2$ from the light sensing portion 4 is transferred to and accumulated under the transfer electrode 3 of the corresponding third layer.

At the next time $t_4$, since $V\phi 3A$ and $V\phi 3B$ are changed to low level, the signal charges $e_1$ and $e_2$ are accumulated in the potential wells continuously formed under the transfer electrode 1 of the first layer to the under side of the transfer electrode 2 of the second layer concerning the (2m+1)'th row, thereby the signal charges $e_1$ and $e_2$ concerning the (2m+1)'th row and the (2m+2)'th row being mixed.

Thereafter, the three-phase drive pulses ($V\phi 1A$, $V\phi 2A$, $V\phi 3A$, $V\phi 1B$, $V\phi 2B$ and $V\phi 3B$) having different phases are supplied to the respective transfer electrodes 1, 2 and 3, thereby sequentially transferring the signal charge ($e_1+e_2$) to the horizontal register side.

As described above, according to the structures of the second embodiment and the modified example, i.e., since the different transfer electrodes 1, 2 and 3 adjacent in every columns are electrically connected to the Al pattern 8 alternately within the respective columns, the drive pulses having different phases can be supplied to the same transfer electrode in adjacent rows. Therefore, the quasi-six-phase driving can be realized as described above. Also, in addition to the full-pixel read-out system corresponding to the non-interlace system, the field read-out operation or frame read-out operation corresponding to the interlace system can be easily achieved.

The electrical connection between the respective transfer electrodes 1, 2, 3 and the Al pattern 8 is achieved alternately in every two columns for one column and the other column, the shunt for the respective transfer electrodes 1, 2 and 3 by the Al pattern 8 can be carried out uniformly.

Figure 24:
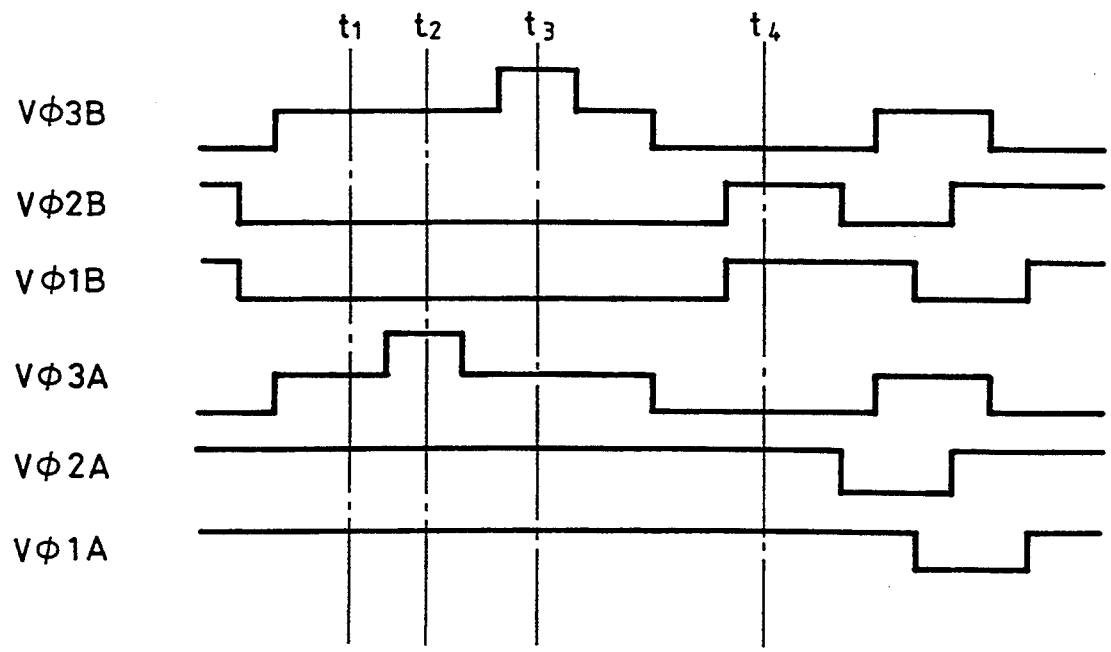
FIG. 24 is a timing chart showing output timings of drive pulses in the second field according to the second embodiment.
Figure 25:
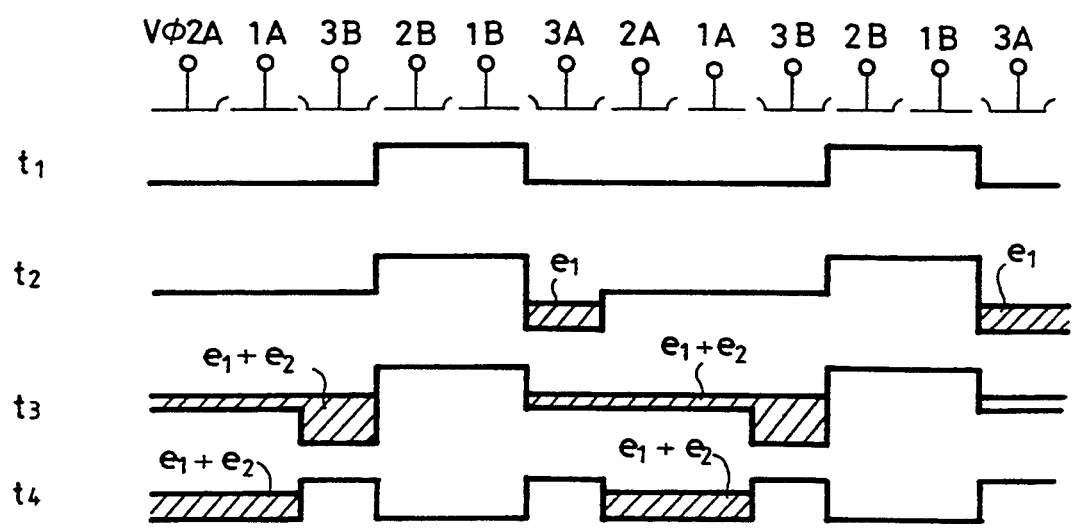
FIG. 25 is an operation conceptual diagram showing the state that electric charges are transferred in the second field according to the second embodiment.

The frame read-out system can be realized when $V\phi 3A$ is not held at read-out level but held at ordinary high level at a timing point $t_2$ in the first field shown in FIG. 22 and $V\phi 3B$ is not held at read-out level but held at ordinary high level at a timing point $t_3$ in the second field shown in FIG. 24.

According to the solid state imager of the present invention, since the signal charge from the light sensing portion can be read out to the under side of the transfer electrode of third layer, not only the full-pixel read-out system corresponding to the non-interlace system but also the field read-out system and the frame read-out system corresponding to the interlace system can be easily achieved.

Having described preferred embodiments of the invention with reference to the accompanying drawings, it is to be understood that the invention is not limited to those precise embodiments and that various changes and modifications thereof could be effected by one skilled in the art without departing from the spirit or scope of the invention as defined in the appended claims.

What is claimed is:

1. A solid state imaging device comprising:
a plurality of pixels arranged in rows and columns, each of said pixels consisting of a light sensing element and a vertical transfer portion adjacent to said light sensing element;
said vertical transfer portion having three gate portions comprising first, second and third gate portions which are insulated from each other, said third gate portion located over said first and second gate portions;

a plurality of rows of base portions mounted on a light sensing portion and extending parallel to each other in a first direction and first base portions connecting first gate portions, second base portions connecting second gate portions and third base portions connecting third gate portions;

a plurality of first conducting bridge portions which connect said third base portions and said third gate portions;

said first conducting bridge portions lying over the first gate in a first column of pixels and lying over the second gate portions in a second column of pixels;

vertical wiring means disposed over said gate portions through an insulating layer, which running in the vertical direction, said vertical wiring means including;

a first wiring film connecting the first gate portions;

a second wiring film connecting the second gate portions;

a third wiring film connecting the third gate portions which is connected to odd rows of said plurality of third base portions;

a fourth wiring film connecting the third gate portions which is connected to even rows of said plurality of third base portions;

read out pulse means which supply read out voltage pulses to said third and fourth wiring films at a first time; and transfer pulse means which respectively supply first, second and third transfer voltage pulses to said first, second and third gate portions at a second time.

2. A solid state imaging device according to claim 1, wherein said read out pulse means supplies a read out voltage pulse to said third and fourth wiring films at different times.

3. A solid state imaging device comprising:

a plurality of pixels arranged in rows and columns, each of said pixels consisting of a light sensing element and a vertical transfer portion adjacent to said light sensing element, said vertical transfer portion having three gate portions comprising first, second and third gate portions which are insulated from each other, said third gate portion located over one of said first and second gate portions and extending to the other of said first and second gate portions;

a plurality of rows of first base portions mounted on a light sensing portion and extending parallel to each other in a first direction and connecting said first gate portions, a plurality of rows of second base portions mounted on the light sensing portion and extending parallel to each other in the first direction and connecting said second gate portions, a plurality of rows of third base portions mounted on the light sensing portion and extending parallel to each other in the first direction and connecting said third gate portions, the third gate portions related to odd rows of said plurality of rows of said third base portions being spaced and insulated from the third gate portions related to even rows of said plurality of rows of said third base portions, vertical wiring means disposed over said gate portions through an insulating layer, which running in the vertical direction, said vertical wiring means including:

a first wiring film connecting the first gate portions, a second wiring film connecting the second gate portions, a third wiring film connecting the third gate portions related to odd rows of said plurality of rows of said third base portions, a forth wiring film connecting the third gate portions related to even rows of said plurality of rows of said third base portions, read out pulse means supplying a read out voltage pulse to said third and fourth wiring films, and transfer pulse means supplying transfer voltage pulse to said first, second and third gate portions so as to transfer signal charges in a second direction which is at right angles to said first direction.

4. A solid state imaging device according to claim 3, wherein said read out pulse means supplies a read out voltage pulse to said third and fourth wiring films at different times.

* * * * *